(12) United States Patent
Pan et al.

(10) Patent No.: US 11,728,232 B2
(45) Date of Patent: *Aug. 15, 2023

(54) SEMICONDUCTOR PACKAGE HAVING A STIFFENER RING

(71) Applicant: Media Tek Inc., Hsin-Chu (TW)

(72) Inventors: Chi-Wen Pan, Hsinchu (TW); I-Hsuan Peng, Hsinchu (TW); Sheng-Liang Kuo, Hsinchu (TW); Yi-Jou Lin, Hsinchu (TW); Tai-Yu Chen, Hsinchu (TW)

(73) Assignee: MediaTek Inc., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/685,303

(22) Filed: Mar. 2, 2022

(65) Prior Publication Data
US 2022/0262691 A1 Aug. 18, 2022

Related U.S. Application Data

(63) Continuation of application No. 16/217,016, filed on Dec. 11, 2018, now Pat. No. 11,302,592, which is a
(Continued)

(51) Int. Cl.
*H01L 23/16* (2006.01)
*H01L 23/367* (2006.01)
(Continued)

(52) U.S. Cl.
CPC .............. *H01L 23/16* (2013.01); *H01L 23/04* (2013.01); *H01L 23/3672* (2013.01);
(Continued)

(58) Field of Classification Search
CPC ... H01L 23/433; H01L 23/3677; H01L 25/18; H01L 23/3736; H01L 23/49816; H01L 23/49827; H01L 24/16; H01L 2224/1635
See application file for complete search history.

(56) References Cited

U.S. PATENT DOCUMENTS

| 5,610,439 A | 3/1997 | Hiyoshi et al. |
| 6,111,313 A | 8/2000 | Kutlu |

(Continued)

FOREIGN PATENT DOCUMENTS

| CN | 106206482 A | 12/2016 |
| CN | 106887414 A | 6/2017 |
| JP | 2004-207415 A | 7/2004 |

OTHER PUBLICATIONS

U.S. Appl. No. 15/863,984, filed Jan. 8, 2018, Chen et al.
U.S. Appl. No. 16/217,016, filed Dec. 11, 2018, Pan et al.

*Primary Examiner* — Monica D Harrison
*Assistant Examiner* — Andre C Stevenson
(74) *Attorney, Agent, or Firm* — Wolf, Greenfield & Sacks, P.C.

(57) ABSTRACT

A semiconductor package includes a package substrate having a top surface and a bottom surface, and a stiffener ring mounted on the top surface of the package substrate. The stiffener ring includes a reinforcement rib that is coplanar with the stiffener ring on the top surface of the package substrate. At least two compartments are defined by the stiffener ring and the reinforcement rib. At least two individual chip packages are mounted on chip mounting regions within the at least two compartments, respectively, thereby constituting a package array on the package substrate.

20 Claims, 17 Drawing Sheets

Related U.S. Application Data continuation-in-part of application No. 15/863,984, filed on Jan. 8, 2018, now Pat. No. 10,573,579.

(60) Provisional application No. 62/616,023, filed on Jan. 11, 2018, provisional application No. 62/468,431, filed on Mar. 8, 2017.

(51) Int. Cl.

| | | |
|---|---|---|
| *H01L 25/065* | (2023.01) | |
| *H01L 23/00* | (2006.01) | |
| *H01L 25/10* | (2006.01) | |
| *H01L 25/03* | (2006.01) | |
| *H01L 23/04* | (2006.01) | |
| *H01L 25/00* | (2006.01) | |
| *H01L 25/18* | (2023.01) | |
| *H01L 23/538* | (2006.01) | |
| *H01L 23/498* | (2006.01) | |

(52) U.S. Cl.
CPC ............ *H01L 23/562* (2013.01); *H01L 25/03* (2013.01); *H01L 25/0655* (2013.01); *H01L 25/10* (2013.01); *H01L 25/18* (2013.01); *H01L 25/50* (2013.01); *H01L 23/367* (2013.01); *H01L 23/49816* (2013.01); *H01L 23/5384* (2013.01); *H01L 24/16* (2013.01); *H01L 24/20* (2013.01); *H01L 24/32* (2013.01); *H01L 24/73* (2013.01); *H01L 24/92* (2013.01); *H01L 2224/12105* (2013.01); *H01L 2224/16225* (2013.01); *H01L 2224/16227* (2013.01); *H01L 2224/32245* (2013.01); *H01L 2224/73204* (2013.01); *H01L 2224/73253* (2013.01); *H01L 2224/92125* (2013.01); *H01L 2224/92225* (2013.01); *H01L 2924/1433* (2013.01); *H01L 2924/1436* (2013.01); *H01L 2924/157* (2013.01); *H01L 2924/15192* (2013.01); *H01L 2924/15311* (2013.01); *H01L 2924/18161* (2013.01); *H01L 2924/18162* (2013.01); *H01L 2924/3511* (2013.01)

(56) References Cited

U.S. PATENT DOCUMENTS

| | | |
|---|---|---|
| 6,362,522 B1 | 3/2002 | Ley |
| 6,459,152 B1 | 10/2002 | Tomita et al. |
| 7,449,363 B2 | 11/2008 | Hsu |
| 9,257,364 B2 | 2/2016 | Ahuja et al. |
| 9,627,288 B2 | 4/2017 | Chen et al. |
| 9,793,187 B2 | 10/2017 | Lin et al. |
| 9,793,191 B2 | 10/2017 | Refai-Ahmed |
| 10,573,579 B2 | 2/2020 | Chen et al. |
| 10,651,127 B2 | 5/2020 | Kong et al. |
| 11,302,592 B2 * | 4/2022 | Pan ..................... H01L 23/3672 |
| 2005/0121757 A1 | 6/2005 | Gealer |
| 2008/0057625 A1 | 3/2008 | Chan et al. |
| 2009/0032926 A1 | 2/2009 | Sharifi |
| 2013/0292855 A1 | 11/2013 | Oppermann et al. |
| 2014/0048326 A1 | 2/2014 | Lin et al. |
| 2014/0048951 A1 | 2/2014 | Lin et al. |
| 2014/0091461 A1 * | 4/2014 | Shen ...................... H01L 23/24 |
| | | 257/737 |
| 2014/0134804 A1 | 5/2014 | Kelly et al. |
| 2014/0353838 A1 | 12/2014 | Lin et al. |
| 2015/0145114 A1 | 5/2015 | Higgins, III |
| 2015/0200186 A1 | 7/2015 | Park |
| 2015/0255391 A1 | 9/2015 | Luo et al. |
| 2015/0357255 A1 | 12/2015 | Lin et al. |
| 2016/0260680 A1 | 9/2016 | Sakata et al. |
| 2017/0053853 A1 | 2/2017 | Refai-Ahmed |
| 2017/0125375 A1 | 5/2017 | Chinnusamy et al. |
| 2018/0047663 A1 | 2/2018 | Camarota |
| 2018/0068993 A1 | 3/2018 | Patel et al. |
| 2018/0151461 A1 | 5/2018 | Cho |
| 2018/0261528 A1 | 9/2018 | Chen et al. |
| 2019/0115269 A1 | 4/2019 | Pan et al. |

* cited by examiner

SEMICONDUCTOR PACKAGE HAVING A STIFFENER RING

CROSS REFERENCE TO RELATED APPLICATION

This Application is a Continuation of U.S. application Ser. No. 16/217,016, filed Dec. 11, 2018, entitled "SEMICONDUCTOR PACKAGE HAVING A STIFFENER RING", which claims priority to U.S. Provisional Application Ser. No. 62/616,023, filed Jan. 11, 2018. application Ser. No. 16/217,016 is a Continuation-in-part of U.S. application Ser. No. 15/863,984, filed Jan. 8, 2018, entitled "SEMICONDUCTOR PACKAGE WITH IMPROVED HEAT DISSIPATION", which claims priority to U.S. Provisional Application Ser. No. 62/468,431, filed Mar. 8, 2017. The entire contents of these applications are incorporated herein by reference in their entirety.

BACKGROUND

The present invention relates generally to semiconductor packaging and, more particularly, to improvements in dissipation of heat from semiconductor devices in such packages.

During operation of an integrated circuit (IC), an IC chip generates heat, thus heating the entire electronics package that contains the chip. Because the performance of the IC chip degrades as its temperature increases, and because high thermal stresses degrade the structural integrity of the electronics package, this heat must be dissipated.

Typically, electronic packages use a metal lid to dissipate heat. The heat from the chip is transferred to the metal lid via a thermally conductive chip/lid interface. The heat is then transferred from the lid to the ambient atmosphere via convection or to a heat sink mounted on the lid. Heat removal becomes a challenge as the die power consumption, die size and heat density increases with every new generation of microprocessors.

Further, warpage that occurs due to differences in the thermal coefficient of expansion (TCE) of the various package components or materials needs to be controlled. To control this warpage, stiffener rings are typically incorporated into the electronic component packages. The stiffener rings provide extra support to the electronic component packages thus reducing warpage.

SUMMARY

It is one object of the invention to a semiconductor package with improved dissipation of heat without compromising the structural rigidity of the package.

According to one embodiment, a semiconductor package includes a package substrate having a top surface and a bottom surface; a stiffener ring mounted on the top surface of the package substrate, wherein the stiffener ring comprises a reinforcement rib that is coplanar with the stiffener ring on the top surface of the package substrate; at least two compartments defined by the stiffener ring and the reinforcement rib; and at least two individual chip packages mounted on chip mounting regions within the at least two compartments, respectively, thereby constituting a package array on the package substrate.

According to some embodiments, the reinforcement rib is a strip-shaped reinforcement rib.

According to some embodiments, the reinforcement rib crosses the center of the semiconductor package.

According to some embodiments, the stiffener ring comprises a grid frame of substantially rectangular outline, and the reinforcement rib is coplanar with the grid frame.

According to some embodiments, the grid frame of the stiffener ring has a width that is different from that of the reinforcement rib.

According to some embodiments, the reinforcement rib is in direct contact with the top surface of the package substrate.

According to some embodiments, the stiffener ring and/or the reinforcement rib is adhered onto a ground ring of the package substrate.

According to some embodiments, the at least two chip packages are electrically connected to each other only through the package substrate.

According to some embodiments, the at least two chip packages are separated by the reinforcement rib on the top surface of the package substrate.

According to some embodiments, the at least two chip packages are flip-chip chip-scale packages (FCCSPs) or wafer-level packages.

According to some embodiments, a plurality of connecting elements are provided on the bottom surface of the package and wherein the package substrate is mounted onto a printed circuit board through the plurality of connecting elements.

According to some embodiments, a rear surface of the at least two chip packages is exposed.

According to some embodiments, the rear surface of the at least two chip packages is flush with a top surface of the stiffener ring.

According to some embodiments, the reinforcement rib and the stiffener ring are formed of a monolithic metal piece.

According to some embodiments, the semiconductor package further comprises surface mount technique (SMT) elements mounted on the top surface of the package substrate along with the at least two chip packages.

According to some embodiments, the at least two chip packages are in thermally contact with the stiffener ring and/or the reinforcement rib.

According to some embodiments, the semiconductor package further comprises a thermally conductive glue or paste disposed in a gap between the at least two chip packages and the reinforcement rib.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, structural, and procedural changes may be made without departing from the spirit and scope of the present disclosure. The following detailed description is, therefore, not to be taken in a limiting sense, and the scope of embodiments of the present invention is defined only by the appended claims.

Figure 1:
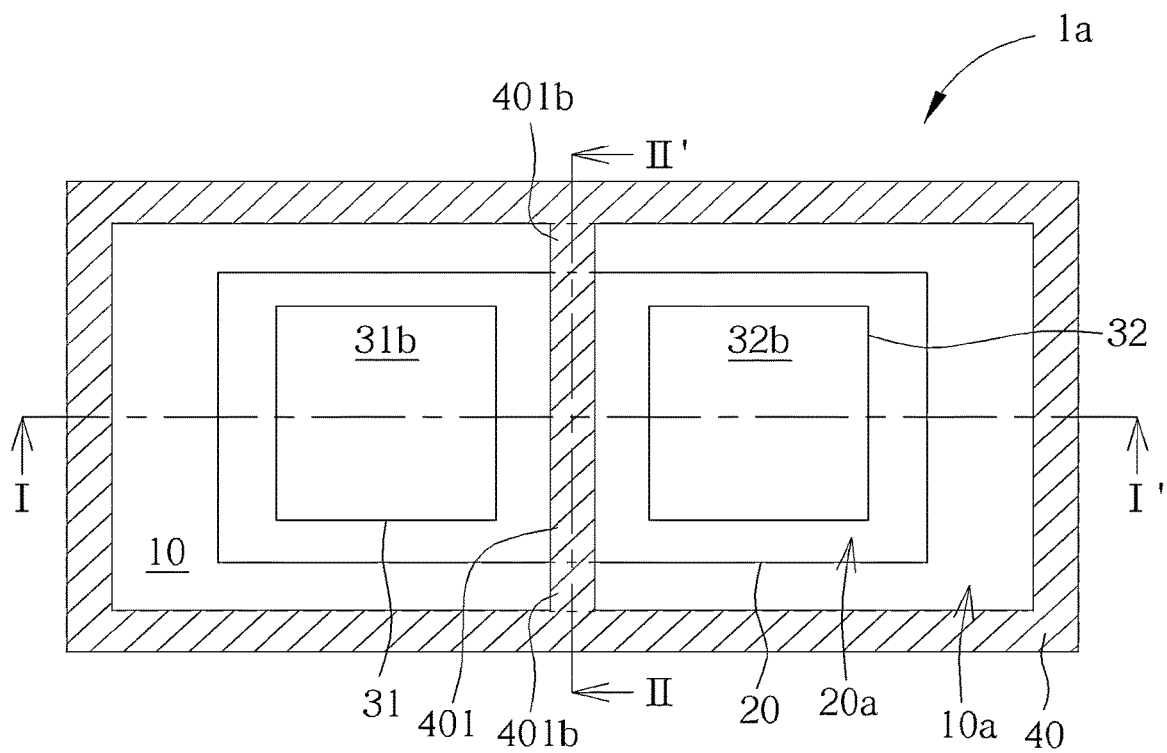
FIG. 1 is a schematic, top view of a semiconductor package according to one embodiment of the invention.
Figure 2:
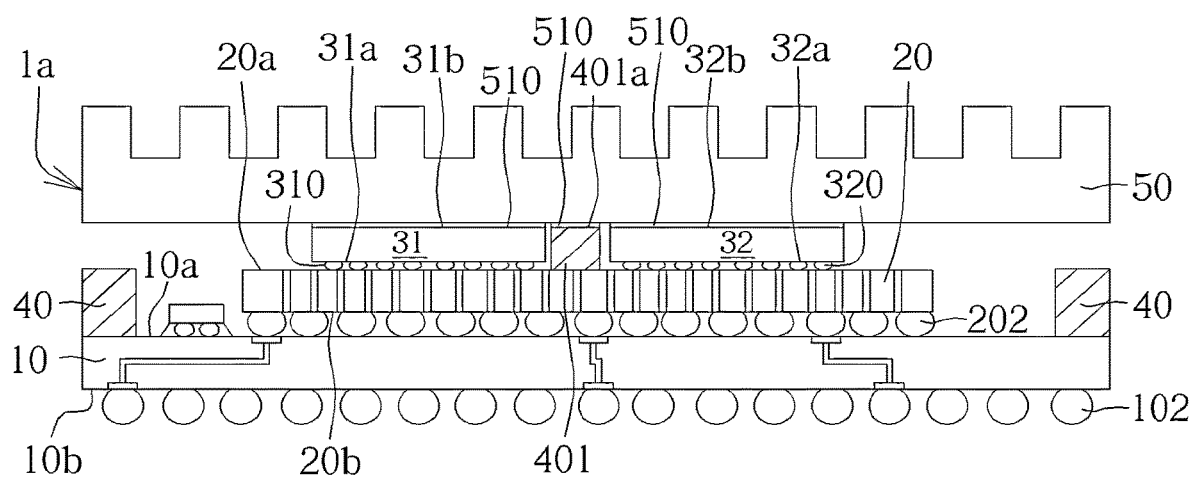
FIG. 2 is a schematic, cross-sectional diagram taken alone line I-I' in FIG. 1.
Figure 3:
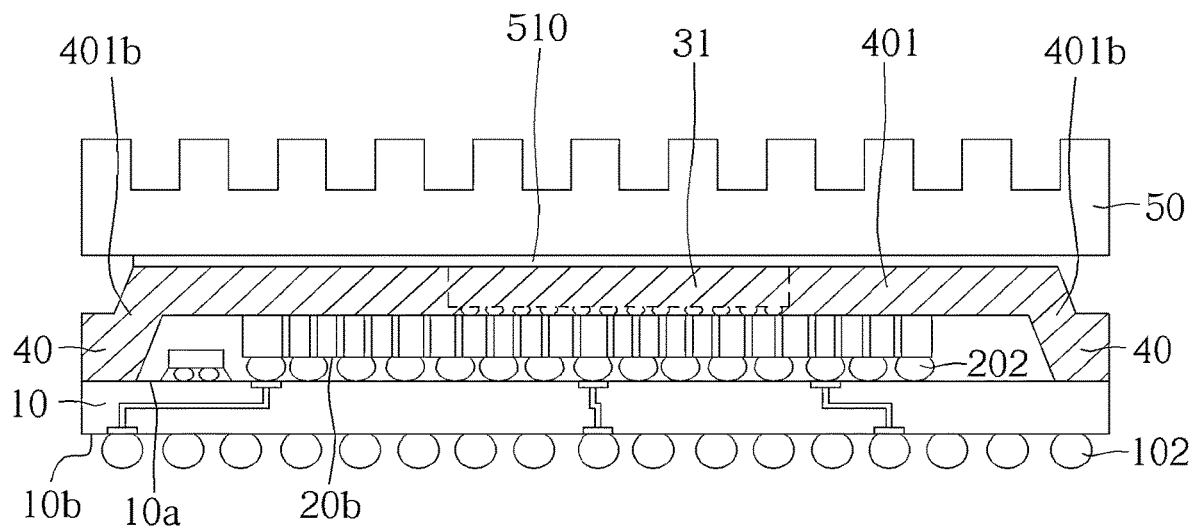
FIG. 3 is a schematic, cross-sectional diagram taken alone line II-II' in FIG. 1.

Please refer to FIG. 1 to FIG. 3. FIG. 1 is a schematic, top view of a semiconductor package according to one embodiment of the invention. FIG. 2 is a schematic, cross-sectional diagram taken alone line I-I' in FIG. 1. FIG. 3 is a schematic, cross-sectional diagram taken alone line II-II' in FIG. 1.

As shown in FIG. 1 to FIG. 3, a semiconductor package 1a is provided. The semiconductor package 1a may be a 2.5D semiconductor package. The semiconductor package 1a comprises a package substrate 10 having a top surface 10a and a bottom surface 10b. An interposer 20 is mounted on the top surface 10a of the package substrate 10. According to one embodiment, the interposer 20 may comprise a silicon interposer or an RDL (re-distribution layer) interposer, but is not limited thereto.

On the bottom surface 10b, a plurality of connecting elements 102 may be provided. For example, the plurality of connecting elements 102 may be sober balls. Through the plurality of connecting elements 102, the semiconductor package 1a may be mounted to a printed circuit board or system board, but is not limited thereto.

A first semiconductor die 31 and a second semiconductor die 32 are mounted on a top surface 20a of the interposer 20 in a side-by-side manner. The first semiconductor die 31 and the second semiconductor die 32 may be flip chips with their active surfaces 31a and 32a facing down to the interposer 20. The first semiconductor die 31 and the second semiconductor die 32 may be connected to the interposer 20 through the bumps 310 and bumps 320 on their active surfaces 31a and 32a, respectively. The interposer 20 provides electrical connections between the dies 31, 32 and the package substrate 10, and possibly between the dies 31, 32 themselves.

According to one embodiment, the first semiconductor die 31 may comprise a System-on-Chip (SOC) chip, an Application-Specific Integrated Chip (ASIC) or a micro-processor, but is not limited thereto. The second semiconductor die 32 may comprise a high bandwidth memory (HBM) chip in which a plurality of memory chips having through silicon vias (TSVs) are stacked or a DRAM die.

It is understood that the first semiconductor die 31 and the second semiconductor die 32 may be both an ASIC or both a SoC chip. According to another embodiment, the first semiconductor die 31 and the second semiconductor die 32 may comprise a SoC and a DRAM die. According to another embodiment, the first semiconductor die 31 and the second semiconductor die 32 may comprise an ASIC and an HBM chip.

It is to be understood that the number of the semiconductor dies in the figures are for illustration purposes only. The number of the semiconductor dies is not limited to two and may exceed two.

On the bottom surface 20b of the interposer 20, a plurality of connecting elements 202 are provided. Through the connecting elements 202, the interposer 20 is electrically connected to the package substrate 10. The first semiconductor die 31 and the second semiconductor die 32 are electrically connected to the package substrate 10 through the interposer 20. In some embodiments, the first semiconductor die 31 and the second semiconductor die 32 may be electrically connected to each other through the interposer 20.

According to one embodiment, a stiffener ring 40 is secured to the top surface 10a of the package substrate 10. The stiffener ring 40 may be disposed along the perimeter of the package substrate 10 so as to form a rectangular shape, for example. The stiffener ring 40 encircles the first semiconductor die 31 and the second semiconductor die 32.

According to one embodiment, the stiffener ring 40 may be secured to the top surface 10a of the package substrate 10 by using an adhesive layer, but is not limited thereto. The stiffener ring 40 may be composed of copper, but is not limited thereto.

According to one embodiment, the stiffener ring 40 comprises a reinforcement rib 401 striding across the interposer 20. According to one embodiment, as can be seen in FIG. 3, the reinforcement rib 401 is integrally connected to the stiffener ring 40 through a downset portion 401b. The reinforcement rib 401 extends through a space between the first semiconductor die 31 and the second semiconductor die 32. The reinforcement rib 401 is in direct contact with the top surface 20a of the interposer 20.

According to one embodiment, no molding compound is used to cover the interposer 20, the first semiconductor die 31, and the second semiconductor die 32. As can be seen in FIG. 1, the reinforcement rib 401 is interposed between the first semiconductor die 31 and the second semiconductor die 32 from the top view of this embodiment. The reinforcement rib 401 is coplanar with the first semiconductor die 31 and the second semiconductor die 32.

According to one embodiment, as can be seen in FIG. 2 and FIG. 3, the semiconductor package 1a may further comprise a heat sink 50. The heat sink 50 may be directly bonded to a rear surface 31b of the first semiconductor die 31, a rear surface 32b of the second semiconductor die 32, and/or a top surface 401a of the reinforcement rib 401 through a thermal interface material (TIM) layer 510. For the sake of clarity, the heat sink 50 is not shown in FIG. 1.

The heat sink 50 may be also bonded to the reinforcement rib 401 between the first semiconductor die 31 and the second semiconductor die 32, which helps to dissipate heat. According to another embodiment, the first semiconductor die 31 and/or the second semiconductor die 32 may be in thermal contact with the reinforcement rib 401.

Figure 4:
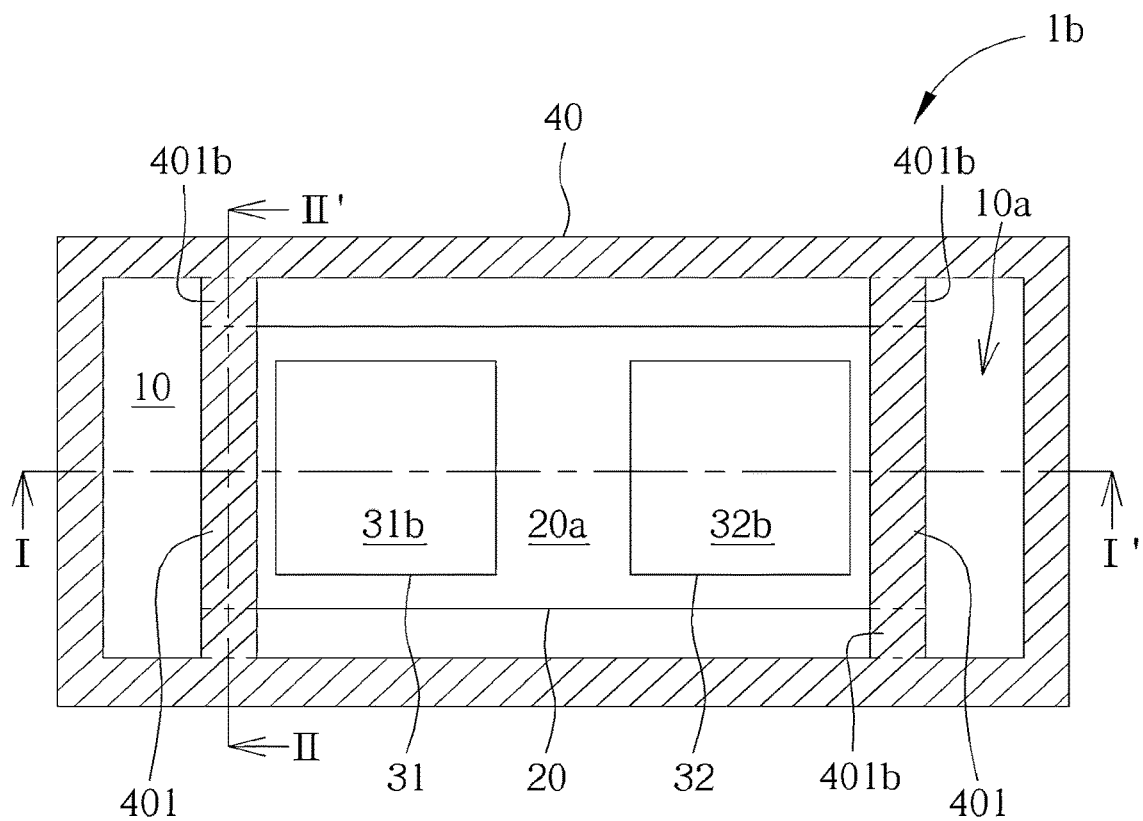
FIG. 4 is a schematic, top view of a semiconductor package according to another embodiment of the invention.
Figure 5:
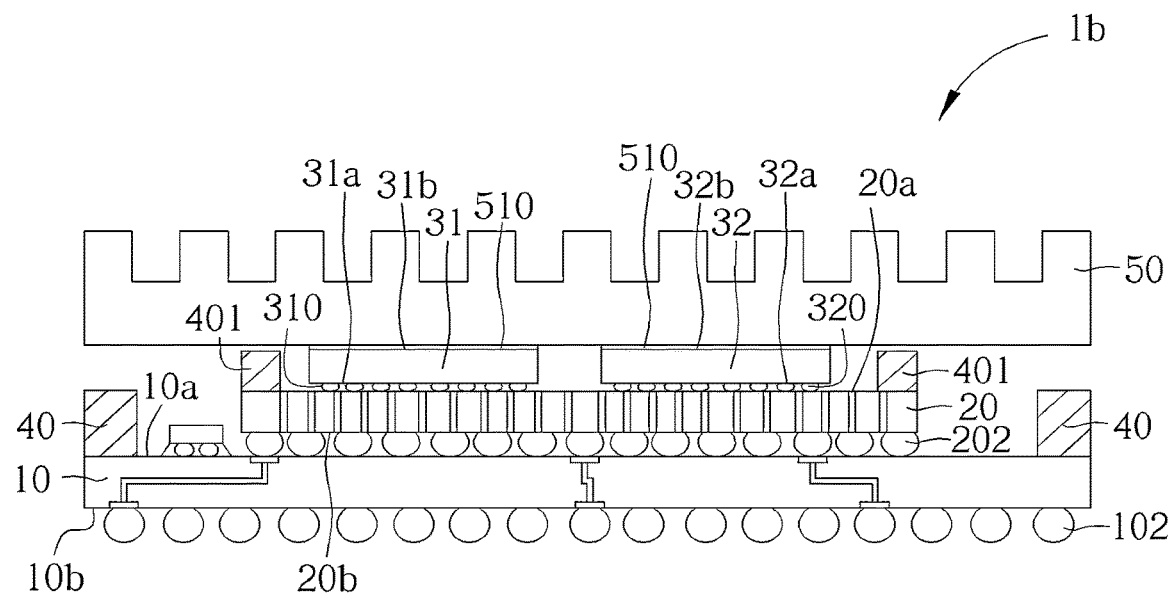
FIG. 5 is a schematic, cross-sectional diagram taken alone line I-I' in FIG. 4.
Figure 6:
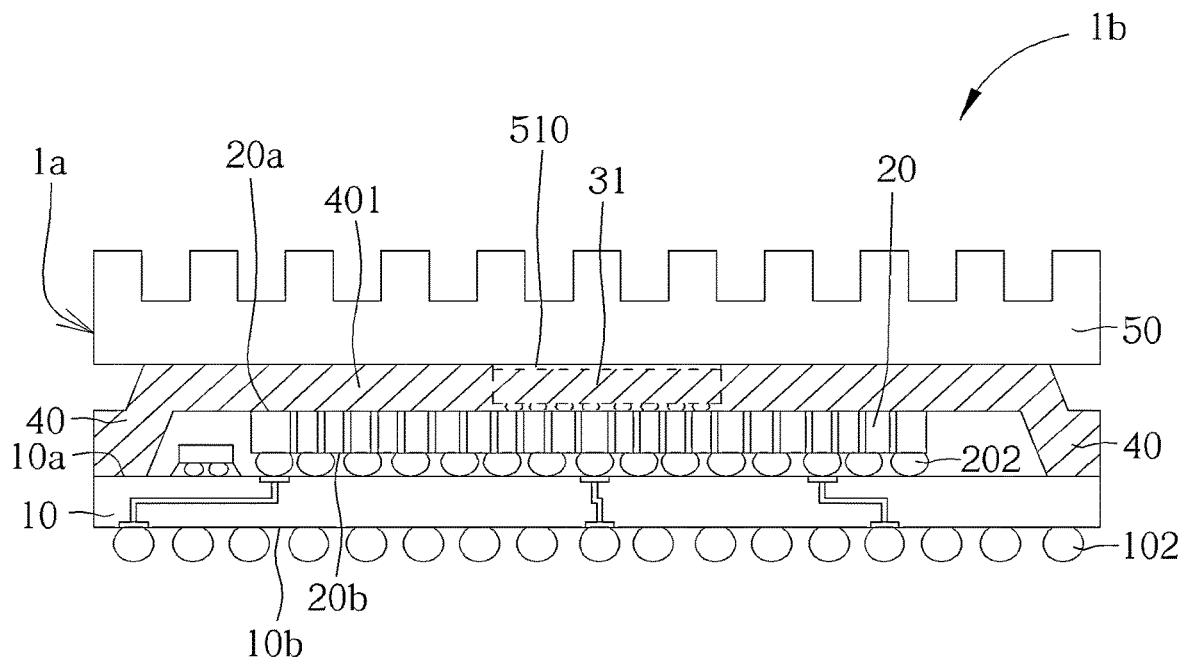
FIG. 6 is a schematic, cross-sectional diagram taken alone line in FIG. 4.

FIG. 4, FIG. 5, and FIG. 6 illustrate another embodiment of the invention, wherein like numeral numbers designate like regions, layers, or elements.

FIG. 4 is a schematic, top view of a semiconductor package according to another embodiment of the invention. FIG. 5 is a schematic, cross-sectional diagram taken alone line I-I' in FIG. 4. FIG. 6 is a schematic, cross-sectional diagram taken alone line II-II' in FIG. 4.

As shown in FIG. 4 to FIG. 6, a semiconductor package 1b is provided. The semiconductor package 1b may be a 2.5D semiconductor package. The semiconductor package 1b comprises a package substrate 10 having a top surface 10a and a bottom surface 10b. An interposer 20 is mounted on the top surface 10a of the package substrate 10. According to one embodiment, the interposer 20 may comprise a silicon interposer or an RDL interposer.

On the bottom surface 10b, a plurality of connecting elements 102 may be provided. For example, the plurality of connecting elements 102 may be sober balls. Through the plurality of connecting elements 102, the semiconductor package 1b may be mounted to a printed circuit board or system board.

Likewise, a first semiconductor die 31 and a second semiconductor die 32 are mounted on a top surface 20a of the interposer 20 in a side-by-side manner. The first semiconductor die 31 and the second semiconductor die 32 may be flip chips with their active surfaces 31a and 32a facing down to the interposer 20. The first semiconductor die 31 and the second semiconductor die 32 may be connected to the interposer 20 through the bumps 310 and bumps 320 on their active surfaces 31a and 32a, respectively.

According to one embodiment, the first semiconductor die 31 may comprise a SOC die, an application-specific integrated chip (ASIC) or a micro-processor, but is not limited thereto. The second semiconductor die 32 may comprise a high bandwidth memory (HBM) chip in which a plurality of memory chips having through silicon vias (TSVs) are stacked, or a DRAM die. According to one embodiment, the first semiconductor die 31 is disposed in close proximity to the second semiconductor die 32. For example, typically, a gap between first semiconductor die 31 and the second semiconductor die 32 may be smaller than 100 micrometers.

On the bottom surface 20b of the interposer 20, a plurality of connecting elements 202 are provided. Through the connecting elements 202, the interposer 20 is electrically connected to the package substrate 10. The first semiconductor die 31 and the second semiconductor die 32 are electrically connected to the package substrate 10 through the interposer 20. In some embodiments, the first semiconductor die 31 and the second semiconductor die 32 may be electrically connected to each other through the interposer 20.

According to one embodiment, a stiffener ring 40 is secured to the top surface 10a of the package substrate 10. The stiffener ring 40 may be disposed along the perimeter of the package substrate 10 so as to form a rectangular shape, for example. The stiffener ring 40 encircles the first semiconductor die 31 and the second semiconductor die 32.

According to one embodiment, the stiffener ring 40 may be secured to the top surface 10a of the package substrate 10 by using an adhesive layer, but is not limited thereto. The stiffener ring 40 may be composed of copper, but is not limited thereto.

According to one embodiment, the stiffener ring 40 comprises two reinforcement ribs 401 striding across the interposer 20. The two reinforcement ribs 401 circumvent the first semiconductor die 31 and the second semiconductor die 32. According to one embodiment, as can be seen in FIG. 4 and FIG. 6, the reinforcement ribs 401 are integrally connected to the stiffener ring 40 through downset portions 401b. The reinforcement ribs 401 extend along the two opposite side edges of the interposer 20. The reinforcement ribs 401 are in direct contact with the top surface 20a of the interposer 20. According to one embodiment, no molding compound is used to cover the interposer 20, the first semiconductor die 31, and the second semiconductor die 32.

Each of the reinforcement ribs 401 does not overlap with the first semiconductor die 31 or the second semiconductor die 32.

According to one embodiment, as can be seen in FIG. 5 and FIG. 6, the semiconductor package 1b may further comprise a heat sink 50. The heat sink 50 may be directly bonded to a rear surface 31b of the first semiconductor die 31, a rear surface 32b of the second semiconductor die 32 through a thermal interface material (TIM) layer 510. For the sake of clarity, the heat sink 50 is not shown in FIG. 4.

The heat sink 50 may be also bonded to the reinforcement rib 401 between the first semiconductor die 31 and the second semiconductor die 32, which helps to dissipate heat. According to another embodiment, the first semiconductor die 31 and/or the second semiconductor die 32 may be in thermal contact with the reinforcement rib 401.

Figure 18:
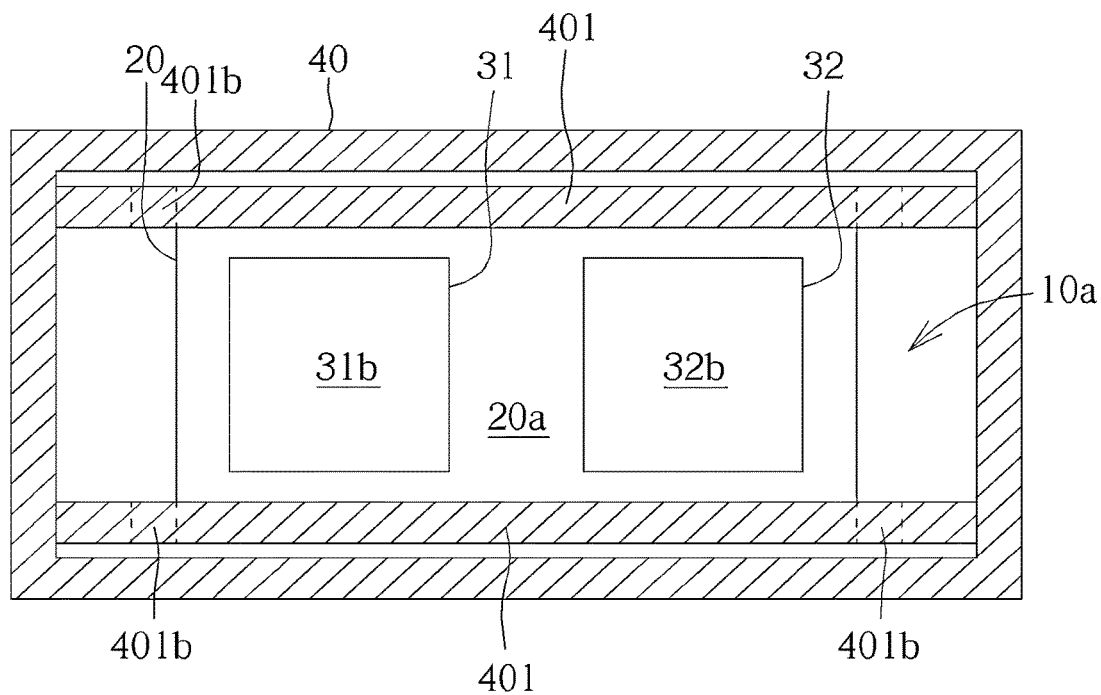
FIG. 18 is a schematic, top view of a semiconductor package according to still another embodiment of the invention, wherein the reinforcement ribs extend along a horizontal direction.
Figure 20:
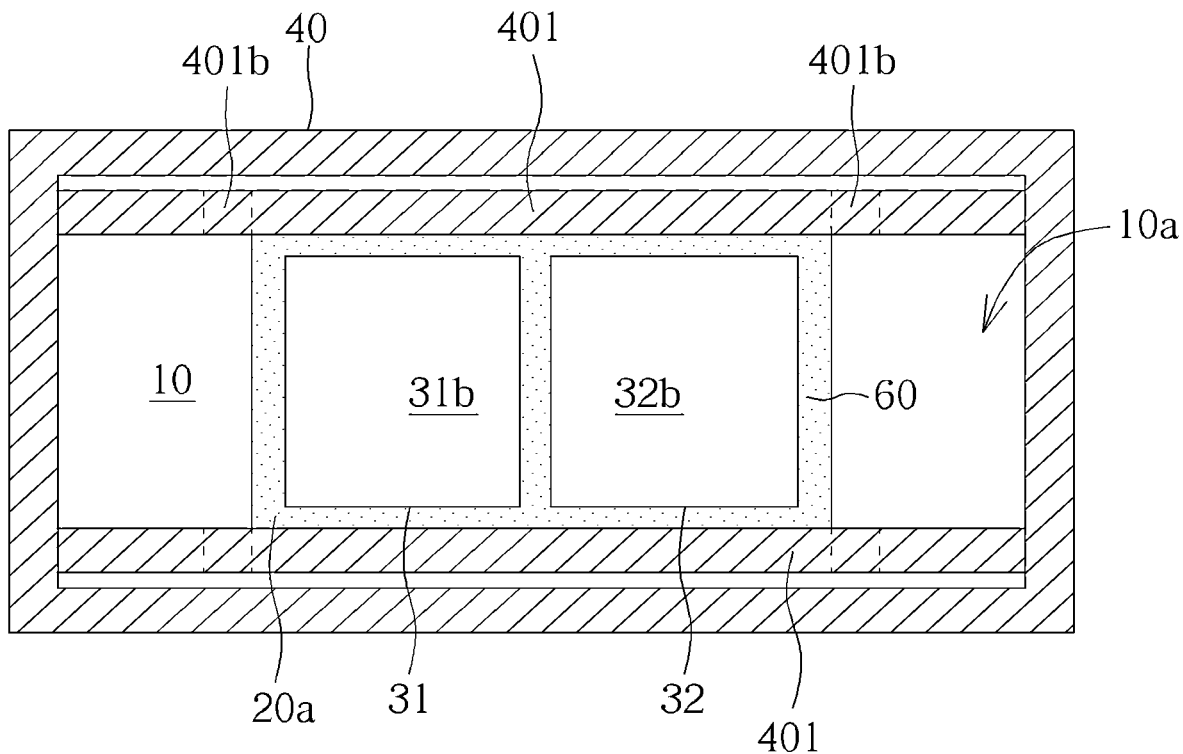
FIG. 20 is a schematic, top view of a semiconductor package according to still another embodiment of the invention, wherein the reinforcement ribs extend along a horizontal direction.

It is understood that the two reinforcement ribs 401 may extend along a direction that is different from the vertical direction as shown in FIG. 4. For example, as shown in FIG. 18 and FIG. 20, the two reinforcement ribs 401 may extend along a horizontal direction along two opposite sides of the each of the first semiconductor die 31 and the second semiconductor die 32. In FIG. 18, the two reinforcement ribs 401 is in direct contact with the top surface 20a of the interposer 20. In FIG. 20, the two reinforcement ribs 401 is in direct contact with a molding compound 60. The molding compound 60 is provided to encapsulate the first semiconductor die 31 and the second semiconductor die 32. The rear surface 31b of the first semiconductor die 31 and the rear surface 32b of the second semiconductor die 32 are not covered by the molding compound 60.

Figure 7:
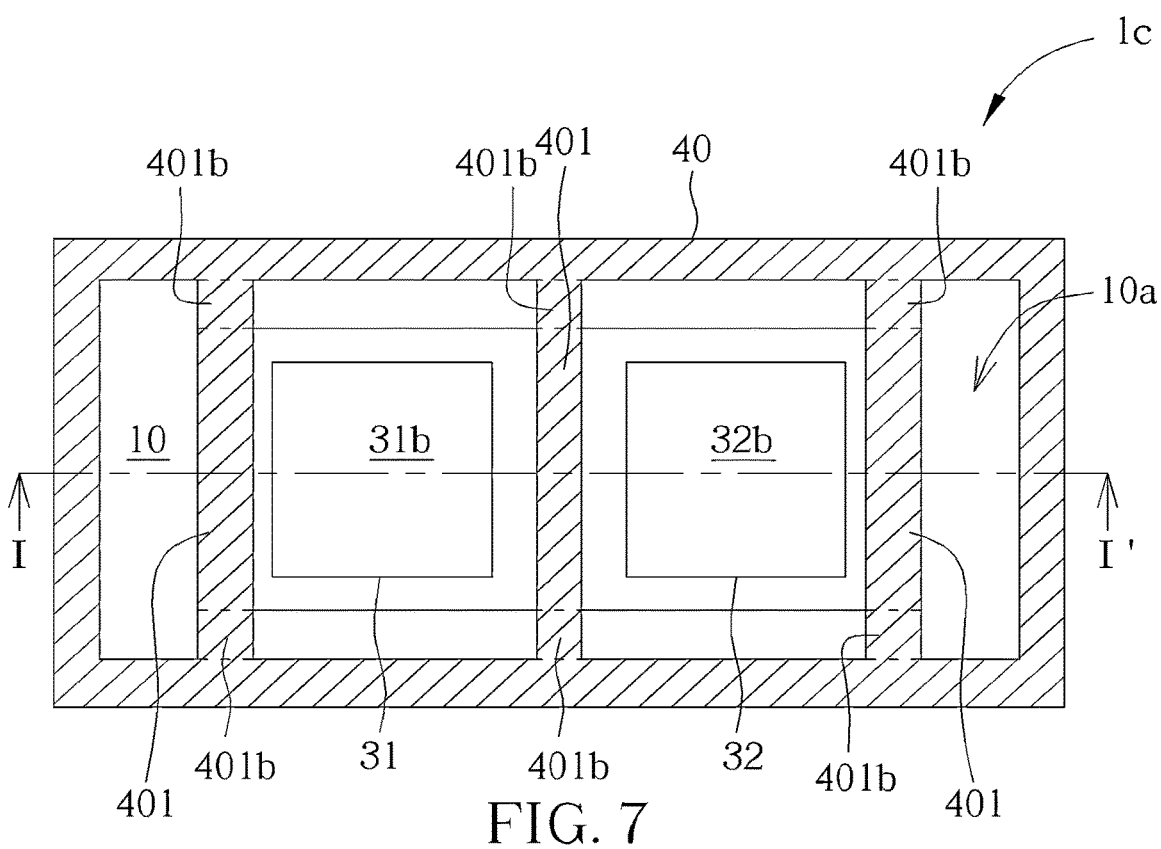
FIG. 7 is a schematic, top view of a semiconductor package according to another embodiment of the invention.
Figure 8:
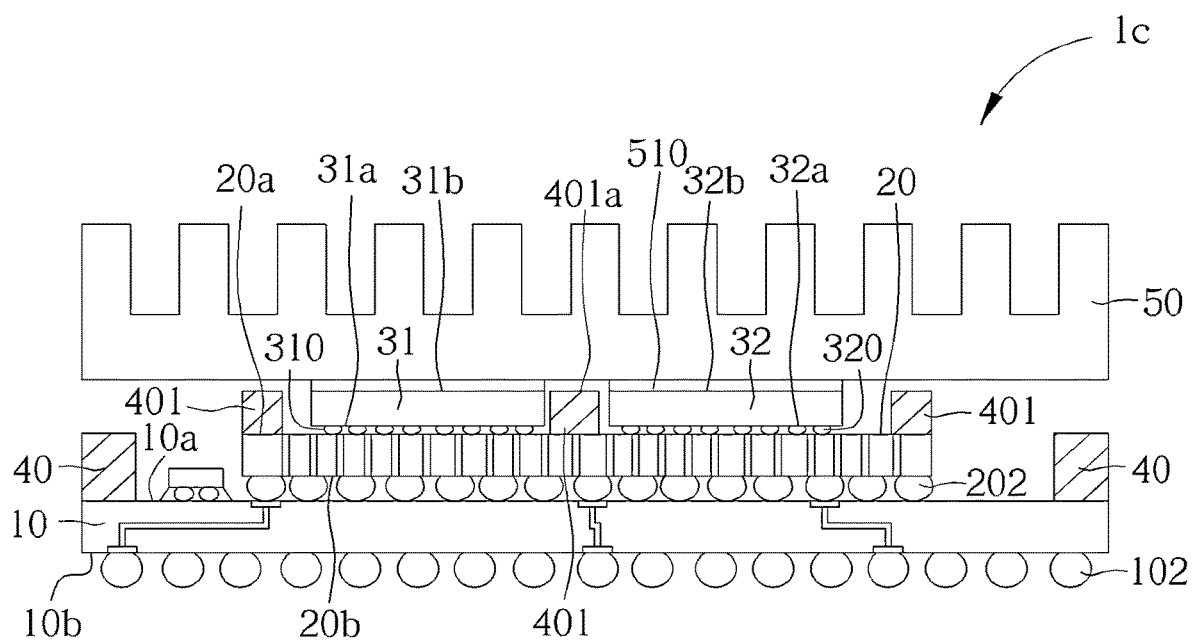
FIG. 8 is a schematic, cross-sectional diagram taken alone line I-I' in FIG. 7.

FIG. 7 and FIG. 8 show another embodiment of the invention, wherein like numeral numbers designate like regions, layers, or elements. FIG. 7 is a schematic, top view of a semiconductor package according to another embodiment of the invention. FIG. 8 is a schematic, cross-sectional diagram taken alone line I-I' in FIG. 7.

As shown in FIG. 7 and FIG. 8, a semiconductor package 1c is provided. The semiconductor package 1c may be a 2.5D semiconductor package. The semiconductor package 1c comprises a package substrate 10 having a top surface 10a and a bottom surface 10b. An interposer 20 is mounted on the top surface 10a of the package substrate 10. According to one embodiment, the interposer 20 may comprise a silicon interposer or an RDL interposer, but is not limited thereto.

According to one embodiment, the stiffener ring 40 comprises three reinforcement ribs 401 striding across the interposer 20. According to one embodiment, as can be seen in FIG. 7, the reinforcement ribs 401 are integrally connected to the stiffener ring 40 through downset portions 401b. Two of the three reinforcement ribs 401 extend along the two opposite side edges of the interposer 20. One of the three reinforcement ribs 401 extends through a space between the first semiconductor die 31 and the second semiconductor die 32. The reinforcement ribs 401 are indirect contact with the top surface 20a of the interposer 20. According to one embodiment, no molding compound is used to cover the interposer 20, the first semiconductor die 31, and the second semiconductor die 32.

According to one embodiment, as can be seen in FIG. 8, the semiconductor package 1c may further comprise a heat sink 50. The heat sink 50 may be directly bonded to a rear surface 31b of the first semiconductor die 31, a rear surface 32b of the second semiconductor die 32 through a thermal interface material (TIM) layer 510. For the sake of clarity, the heat sink 50 is not shown in FIG. 7.

Figure 9:
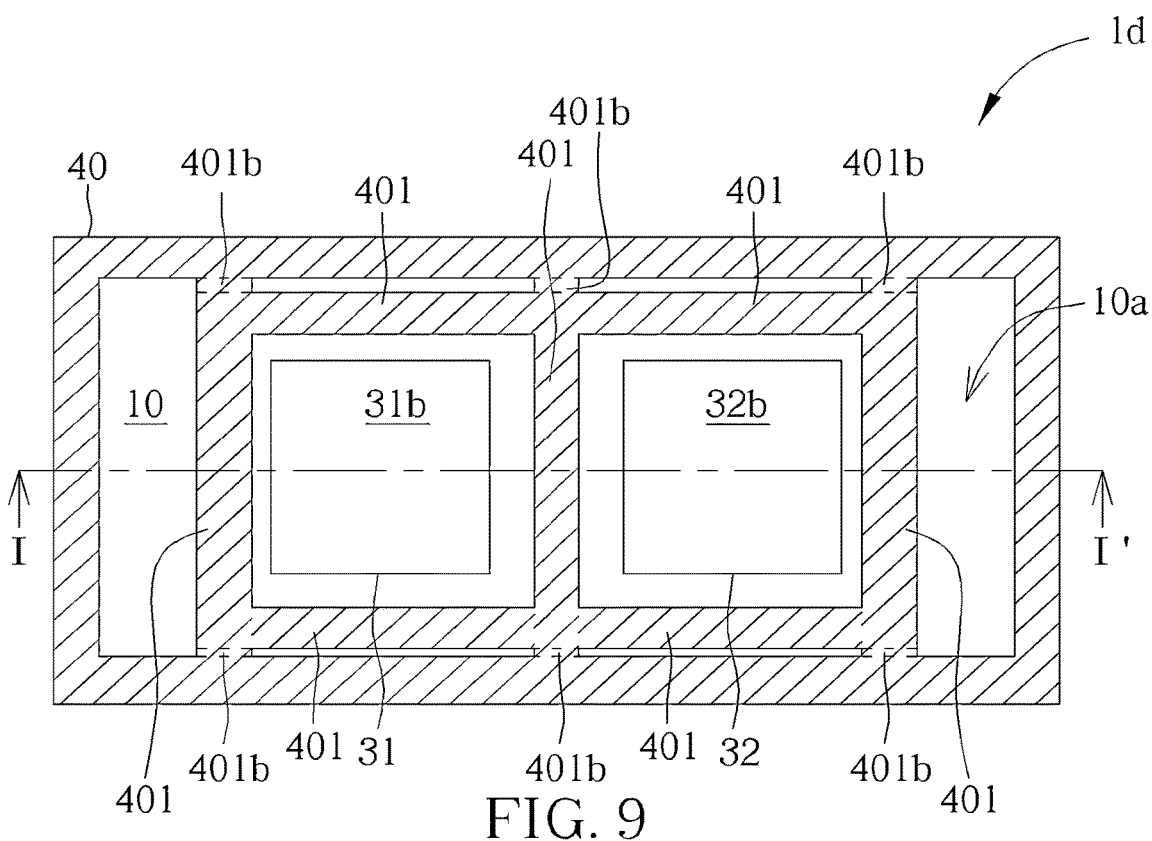
FIG. 9 is a schematic, top view of a semiconductor package according to another embodiment of the invention.
Figure 10:
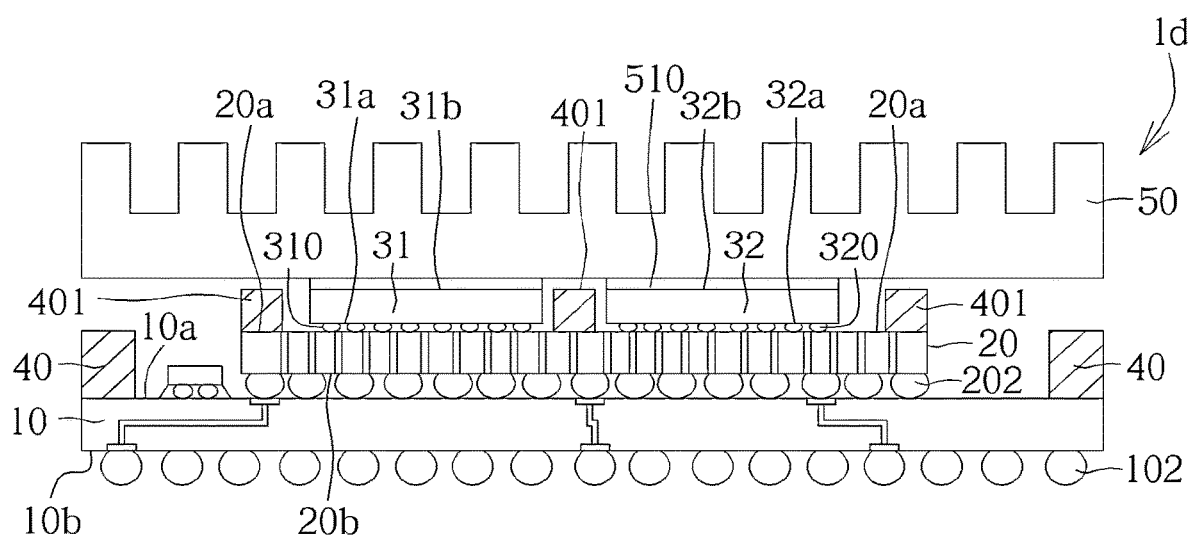
FIG. 10 is a schematic, cross-sectional diagram taken alone line I-I' in FIG. 9.

FIG. 9 and FIG. 10 show another embodiment of the invention, wherein like numeral numbers designate like regions, layers, or elements. FIG. 9 is a schematic, top view of a semiconductor package according to another embodiment of the invention. FIG. 10 is a schematic, cross-sectional diagram taken alone line I-I' in FIG. 9.

As shown in FIG. 9 and FIG. 10, a semiconductor package 1d is provided. The semiconductor package 1d may be a 2.5D semiconductor package. The semiconductor package 1d comprises a package substrate 10 having a top surface 10a and a bottom surface 10b. An interposer 20 is mounted on the top surface 10a of the package substrate 10. According to one embodiment, the interposer 20 may comprise a silicon interposer or an RDL interposer, but is not limited thereto.

According to one embodiment, the stiffener ring 40 comprises multiple reinforcement ribs 401 striding across the interposer 20. The multiple reinforcement ribs 401 may be shaped into frames that encircle the first semiconductor die 31 and the second semiconductor die 32. According to one embodiment, as can be seen in FIG. 9, the reinforcement ribs 401 are integrally connected to the stiffener ring 40 through downset portions 401b. The reinforcement ribs 401 are in direct contact with the top surface 20a of the interposer 20.

According to one embodiment, no molding compound is used to cover the interposer 20, the first semiconductor die 31, and the second semiconductor die 32.

According to one embodiment, as can be seen in FIG. 10, the semiconductor package 1d may further comprise a heat sink 50. The heat sink 50 may be directly bonded to a rear surface 31b of the first semiconductor die 31, a rear surface 32b of the second semiconductor die 32 through a thermal interface material (TIM) layer 510. For the sake of clarity, the heat sink 50 is not shown in FIG. 9.

Figure 11:
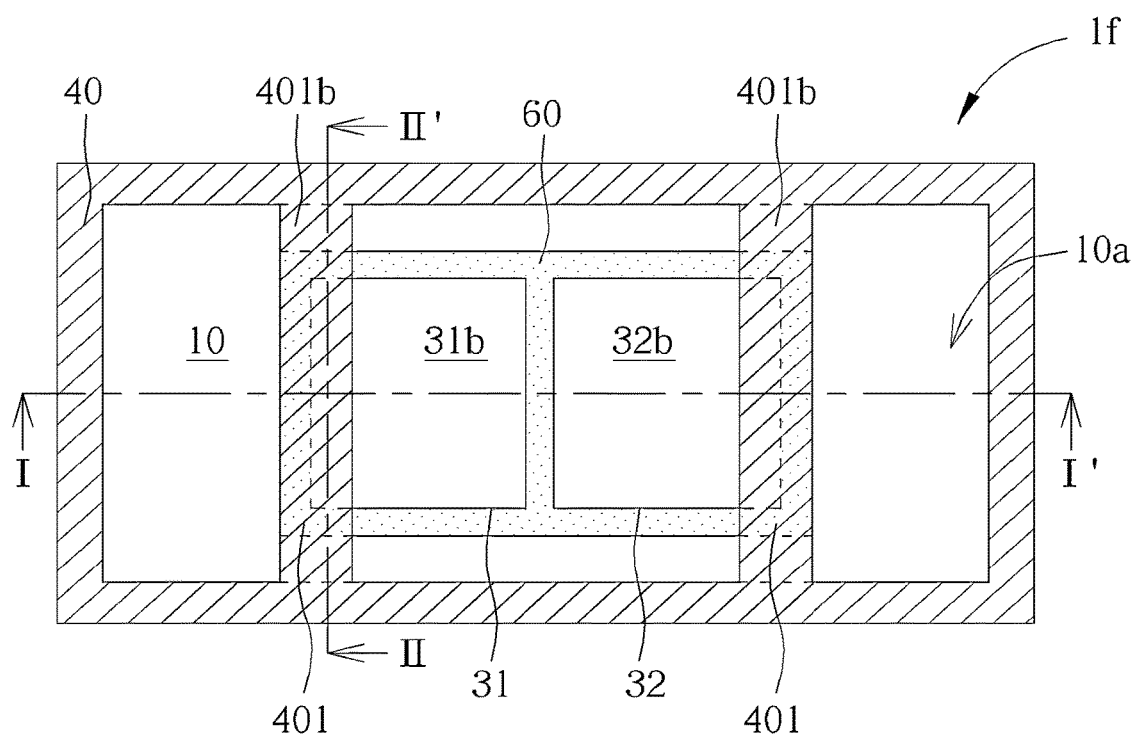
FIG. 11 is a schematic, top view of a semiconductor package according to another embodiment of the invention.
Figure 12:
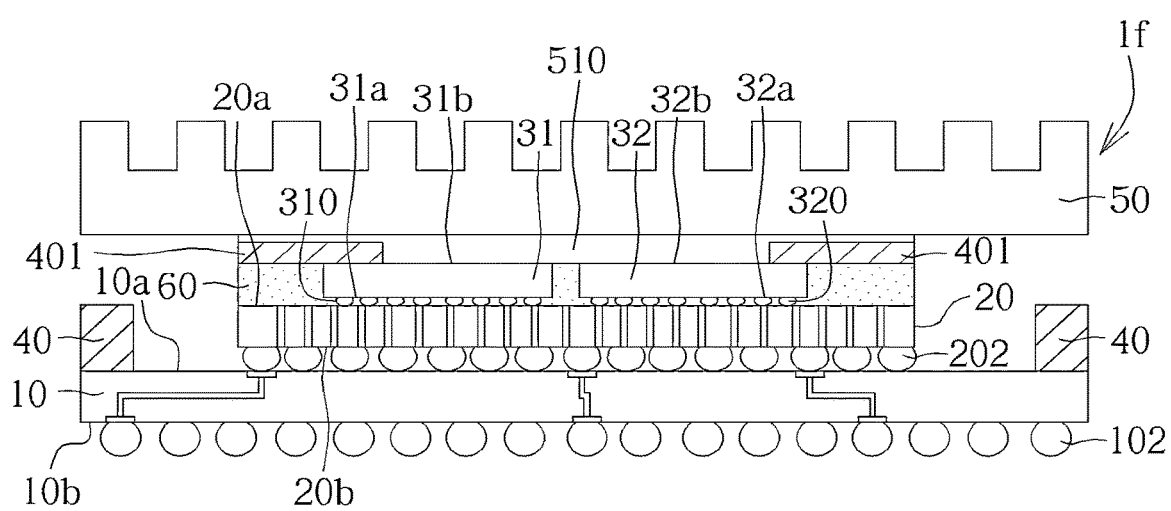
FIG. 12 is a schematic, cross-sectional diagram taken alone line I-I' in FIG. 11.
Figure 13:
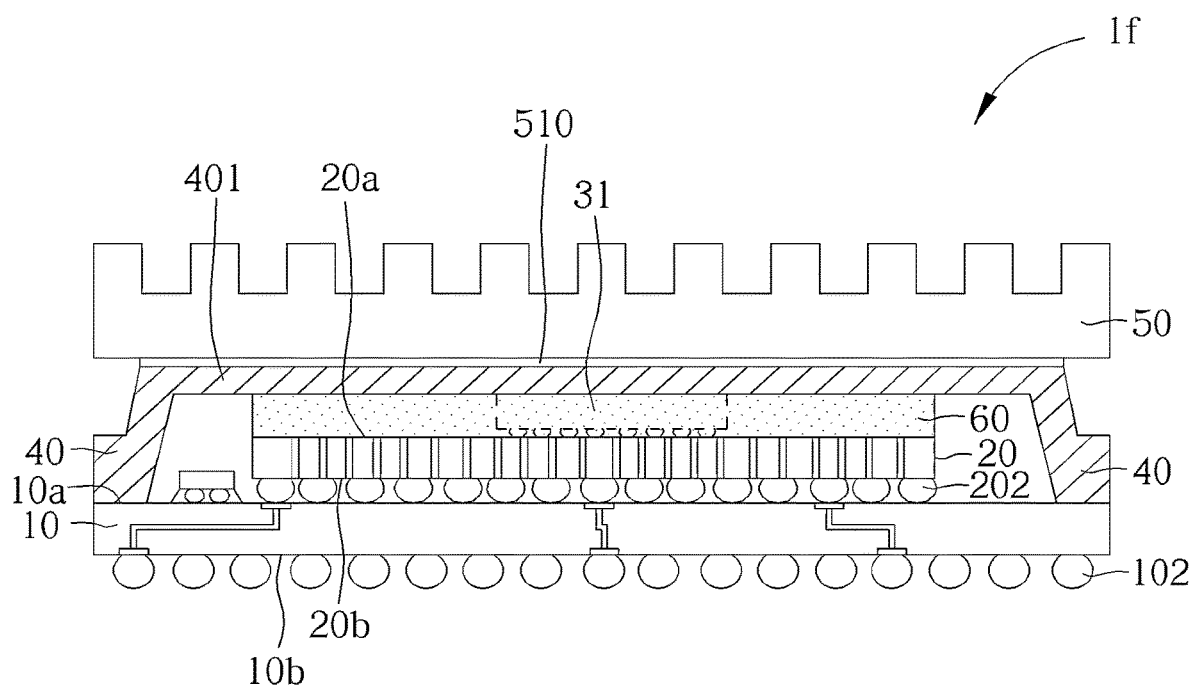
FIG. 13 is a schematic, cross-sectional diagram taken alone line II-II' in FIG. 11.

FIG. 11, FIG. 12, and FIG. 13 show another embodiment of the invention, wherein like numeral numbers designate like regions, layers, or elements. FIG. 11 is a schematic, top view of a semiconductor package according to another embodiment of the invention. FIG. 12 is a schematic, cross-sectional diagram taken alone line I-I' in FIG. 11. FIG. 13 is a schematic, cross-sectional diagram taken alone line II-II' in FIG. 11.

As shown in FIG. 11 to FIG. 13, a semiconductor package if is provided. The semiconductor package if may be a 2.5D semiconductor package. The semiconductor package if comprises a package substrate 10 having a top surface 10a and a bottom surface 10b. An interposer 20 is mounted on the top surface 10a of the package substrate 10. According to one embodiment, the interposer 20 may comprise a silicon interposer or an RDL interposer, but is not limited thereto.

On the bottom surface 10b, a plurality of connecting elements 102 may be provided. For example, the plurality of connecting elements 102 may be sober balls. Through the plurality of connecting elements 102, the semiconductor package if may be mounted to a printed circuit board or system board, but is not limited thereto.

Likewise, a first semiconductor die 31 and a second semiconductor die 32 are mounted on a top surface 20a of the interposer 20 in a side-by-side manner. The first semiconductor die 31 and the second semiconductor die 32 may be flip chips with their active surfaces 31a and 32a facing down to the interposer 20. The first semiconductor die 31 and the second semiconductor die 32 may be connected to the interposer 20 through the bumps 310 and bumps 320 on their active surfaces 31a and 32a, respectively.

According to one embodiment, the first semiconductor die 31 may comprise a SOC die, an application-specific integrated chip (ASIC) or a micro-processor, but is not limited thereto. The second semiconductor die 32 may comprise a high bandwidth memory (HBM) chip in which a plurality of memory chips having through silicon vias (TSVs) are stacked, or a DRAM die.

It is understood that the first semiconductor die 31 and the second semiconductor die 32 may be both ASIC or both System-on-Chip (SoC) chip. According to another embodiment, the first semiconductor die 31 and the second semiconductor die 32 may comprise a SoC and a DRAM die. According to another embodiment, the first semiconductor die 31 and the second semiconductor die 32 may comprise an ASIC and an HBM chip. Although only two semiconductor dies are illustrated in the figures, it is understood that the semiconductor package may comprise more than two semiconductor dies in other embodiments.

On the bottom surface 20b of the interposer 20, a plurality of connecting elements 202 are provided. Through the connecting elements 202, the interposer 20 is electrically connected to the package substrate 10. The first semiconductor die 31 and the second semiconductor die 32 are electrically connected to the package substrate 10 through the interposer 20. In some embodiments, the first semiconductor die 31 and the second semiconductor die 32 may be electrically connected to each other through the interposer 20.

According to one embodiment, a molding compound 60 is provided to encapsulate the first semiconductor die 31 and the second semiconductor die 32. The rear surface 31b of the first semiconductor die 31 and the rear surface 32b of the second semiconductor die 32 are not covered by the molding compound 60.

According to one embodiment, a stiffener ring 40 is secured to the top surface 10a of the package substrate 10. The stiffener ring 40 may be disposed along the perimeter of the package substrate 10 so as to form a rectangular shape, for example. The stiffener ring 40 encircles the first semiconductor die 31 and the second semiconductor die 32.

According to one embodiment, the stiffener ring 40 may be secured to the top surface 10a of the package substrate 10 by using an adhesive layer, but is not limited thereto. The stiffener ring 40 may be composed of copper, but is not limited thereto.

According to one embodiment, the stiffener ring 40 comprises two reinforcement ribs 401 striding across the molding compound 60. According to one embodiment, as can be seen in FIG. 11 and FIG. 13, the reinforcement ribs 401 are integrally connected to the stiffener ring 40 through downset portions 401b. The reinforcement ribs 401 extend along the two opposite side edges of the interposer 20. The reinforcement ribs 401 are in direct contact with the top surface 20a of the molding compound 60.

According to one embodiment, the semiconductor package if may further comprise a heat sink 50. The heat sink 50 may be directly bonded to a rear surface 31b of the first semiconductor die 31, a rear surface 32b of the second semiconductor die 32, and a top surface 401a of the reinforcement rib 401 through a thermal interface material (TIM) layer 510. As can be seen in FIG. 11, the reinforcement ribs 401 may partially overlap with the rear surface of the first semiconductor die 31 or the second semiconductor die 32. For the sake of clarity, the heat sink 50 is not shown in FIG. 11. According to one embodiment, the reinforcement ribs 401 may be in direct contact with the rear surface of the first semiconductor die 31 or the second semiconductor die 32.

Figure 19:
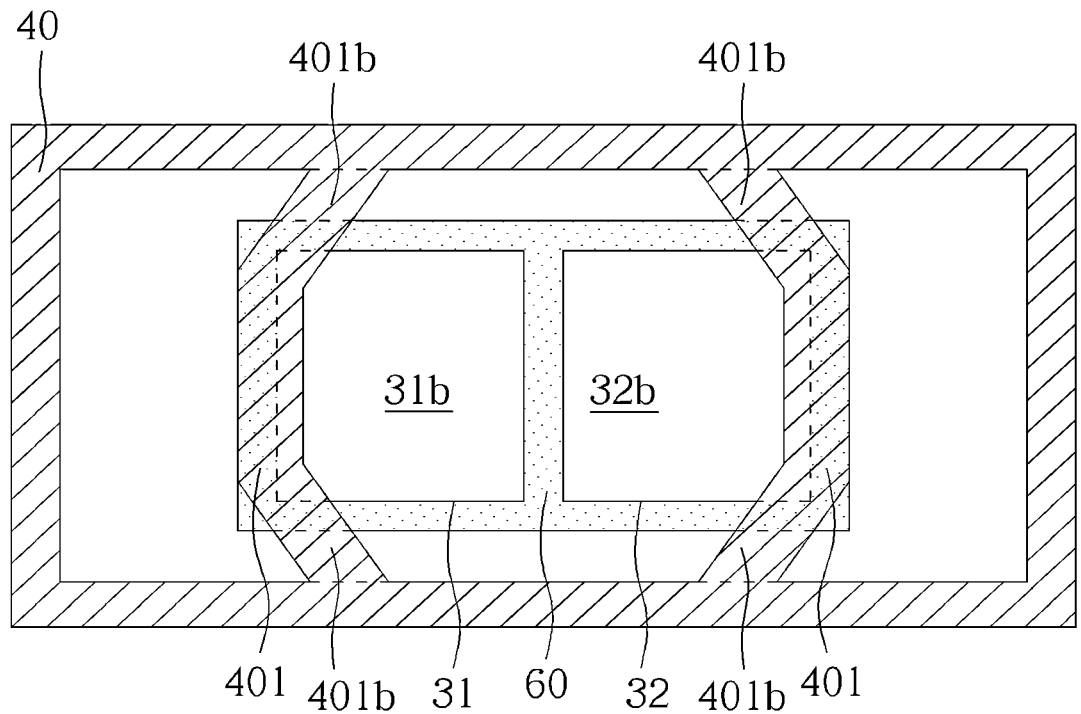
FIG. 19 is a schematic, top view of a semiconductor package according to still another embodiment of the invention, wherein the reinforcement ribs form an octagonal structure with the surrounding stiffener ring.

According to one embodiment, the reinforcement ribs 401 may be a straight-line shaped rib across the molding compound 60 when viewed from the above. However, it is understood that the reinforcement ribs 401 may have other shapes. For example, in FIG. 19, the reinforcement ribs 401 are bent so as to form an octagonal structure with the surrounding stiffener ring 40. Such octagonal structure may provide better structural rigidity for the semiconductor package.

Figure 14:
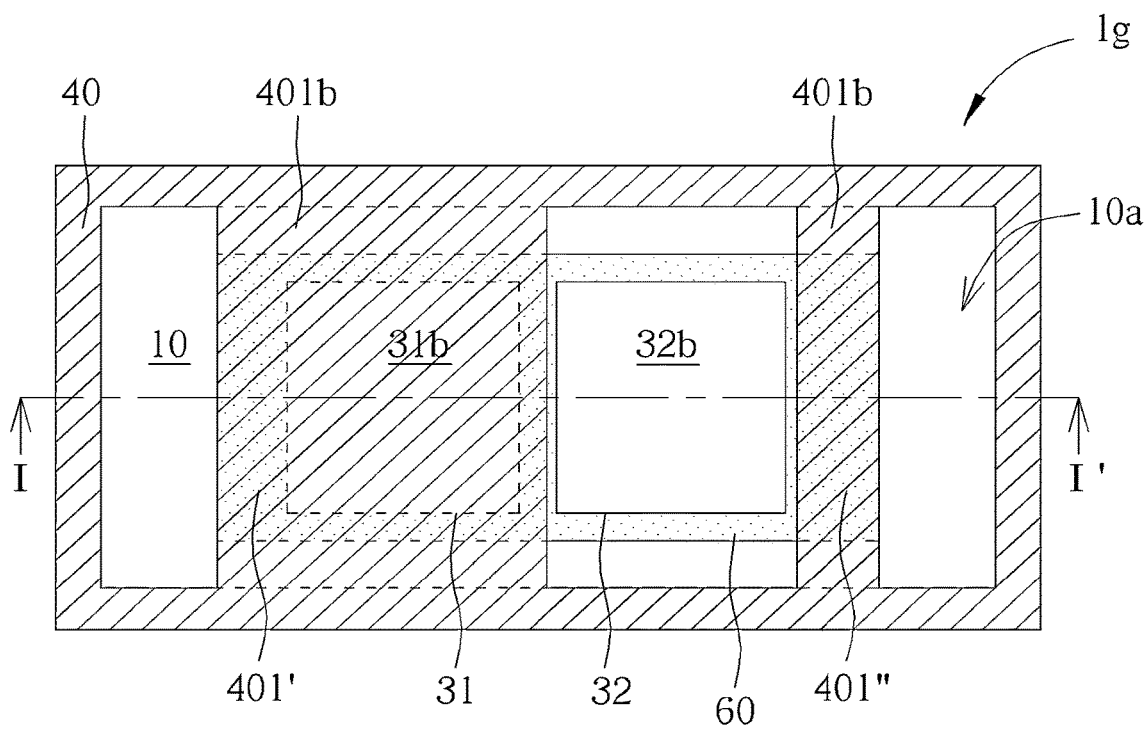
FIG. 14 is a schematic, top view of a semiconductor package according to another embodiment of the invention.
Figure 15:
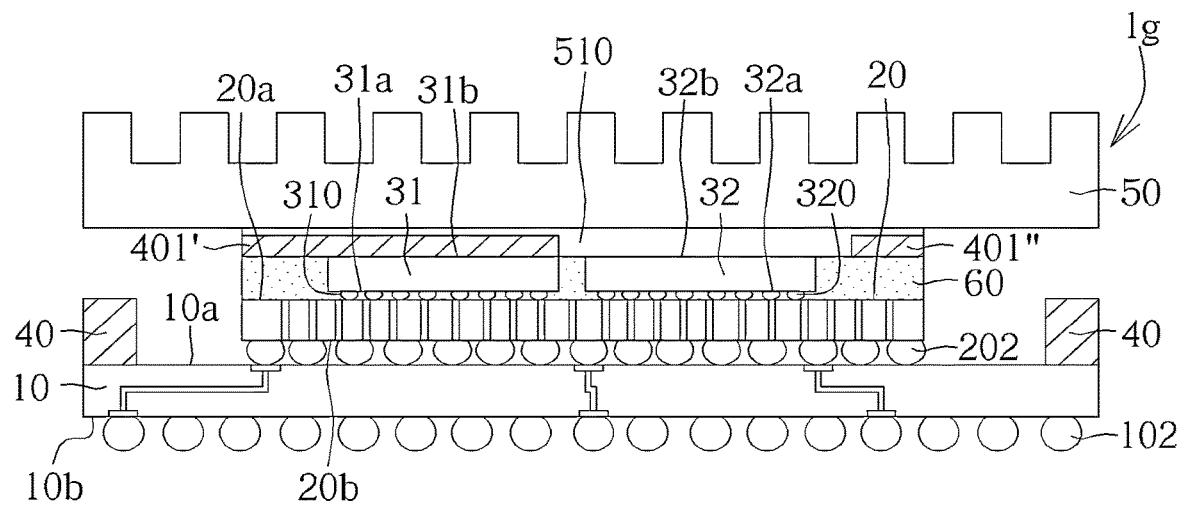
FIG. 15 is a schematic, cross-sectional diagram taken alone line I-I' in FIG. 14.

FIG. 14 and FIG. 15 show another embodiment of the invention, wherein like numeral numbers designate like regions, layers, or elements. FIG. 14 is a schematic, top view of a semiconductor package according to another embodiment of the invention. FIG. 15 is a schematic, cross-sectional diagram taken alone line I-I' in FIG. 14.

As shown in FIG. 14 and FIG. 15, a semiconductor package 1g is provided. The semiconductor package 1g may be a 2.5D semiconductor package. The semiconductor package 1g comprises a package substrate 10 having a top surface 10a and a bottom surface 10b. An interposer 20 is mounted on the top surface 10a of the package substrate 10. According to one embodiment, the interposer 20 may comprise a silicon interposer or an RDL interposer, but is not limited thereto.

According to one embodiment, the molding compound 60 is provided to encapsulate the first semiconductor die 31 and the second semiconductor die 32. The rear surface 31b of the first semiconductor die 31 and the rear surface 32b of the second semiconductor die 32 are not covered by the molding compound 60.

According to one embodiment, the stiffener ring 40 comprises two reinforcement ribs 401' and 401" striding across the molding compound 60. According to one embodiment, as can be seen in FIG. 14, the reinforcement ribs 401' and 401" are integrally connected to the stiffener ring 40 through downset portions 401b. An asymmetric reinforcement rib configuration may be employed. For example, the three reinforcement rib 401' has a greater width (or surface area) than that of the reinforcement rib 401".

According to one embodiment, for example, the reinforcement rib 401' may completely overlap with the rear surface 31b of the first semiconductor die 31. For example, the reinforcement rib 401" may extend along a side edge of the interposer 20 and may not overlap with the second semiconductor die 32 when viewed from the above.

Figure 16:
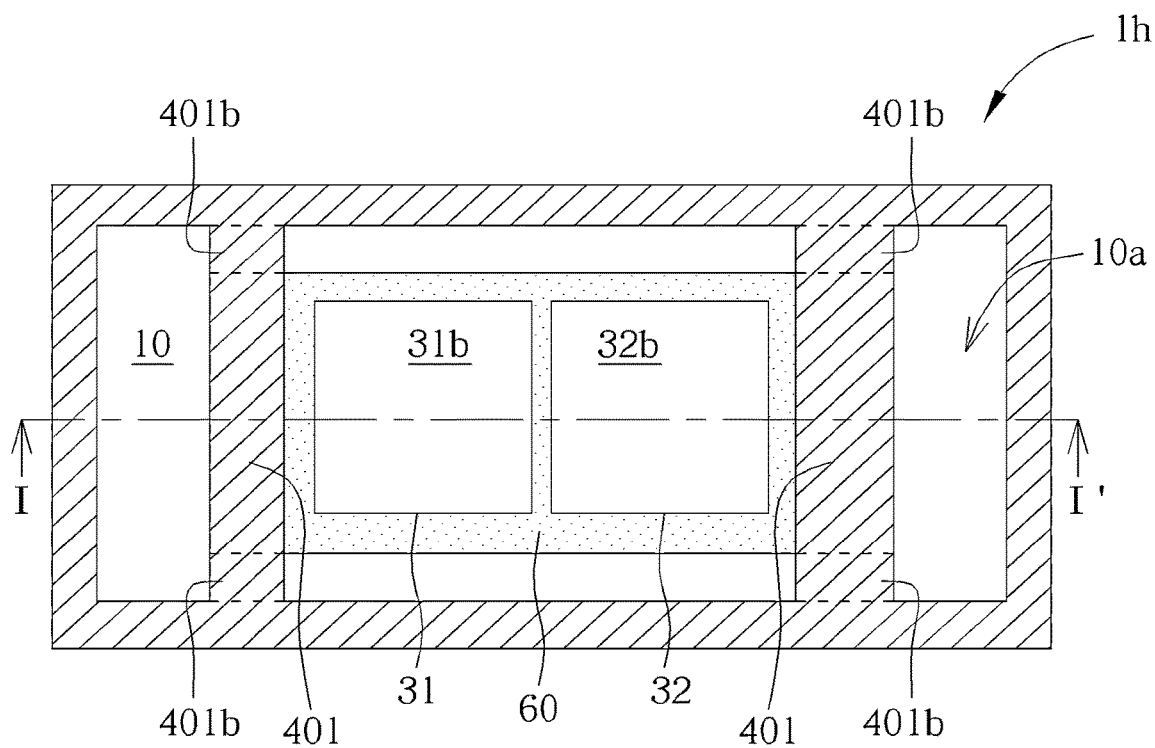
FIG. 16 is a schematic, top view of a semiconductor package according to another embodiment of the invention.
Figure 17:
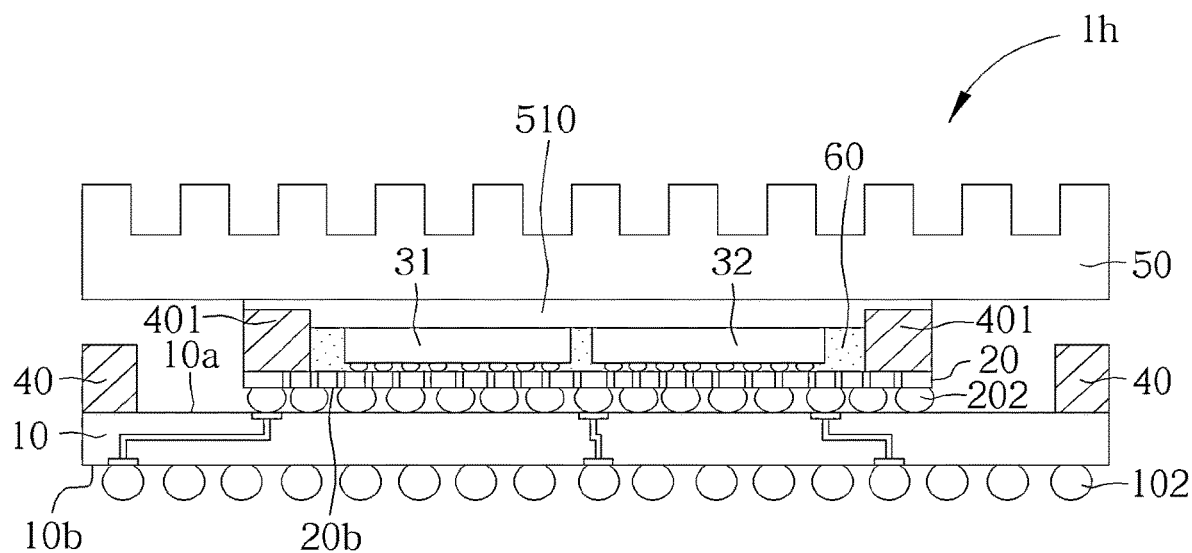
FIG. 17 is a schematic, cross-sectional diagram taken alone line I-I' in FIG. 16.

FIG. 16 and FIG. 17 show another embodiment of the invention, wherein like numeral numbers designate like regions, layers, or elements. FIG. 16 is a schematic, top view of a semiconductor package according to another embodiment of the invention. FIG. 17 is a schematic, cross-sectional diagram taken alone line I-I' in FIG. 16.

As shown in FIG. 16 and FIG. 17, a semiconductor package 1h is provided. The semiconductor package 1h may be a 2.5D semiconductor package. The semiconductor package 1h comprises a package substrate 10 having a top surface 10a and a bottom surface 10b. An interposer 20 is mounted on the top surface 10a of the package substrate 10. According to one embodiment, the interposer 20 may comprise a silicon interposer or an RDL interposer, but is not limited thereto.

According to one embodiment, the molding compound 60 is provided to encapsulate the first semiconductor die 31 and the second semiconductor die 32. The rear surface 31b of the first semiconductor die 31 and the rear surface 32b of the second semiconductor die 32 are not covered by the molding compound 60.

According to one embodiment, the stiffener ring 40 comprises two reinforcement ribs 401 striding across the interposer 20. According to one embodiment, as can be seen in FIG. 16, the reinforcement ribs 401 are integrally connected to the stiffener ring 40 through downset portions 401b. As can be seen in FIG. 17, the reinforcement ribs 401 are in direct contact with the top surface 20a of the interposer 20 and the peripheral sidewalls of the molding compound 60. The reinforcement rib 401, the first semiconductor die 31 and the second semiconductor die 32 may be in thermal contact with the heat sink 50 through the thermal interface material (TIM) layer 510.

Figure 21:
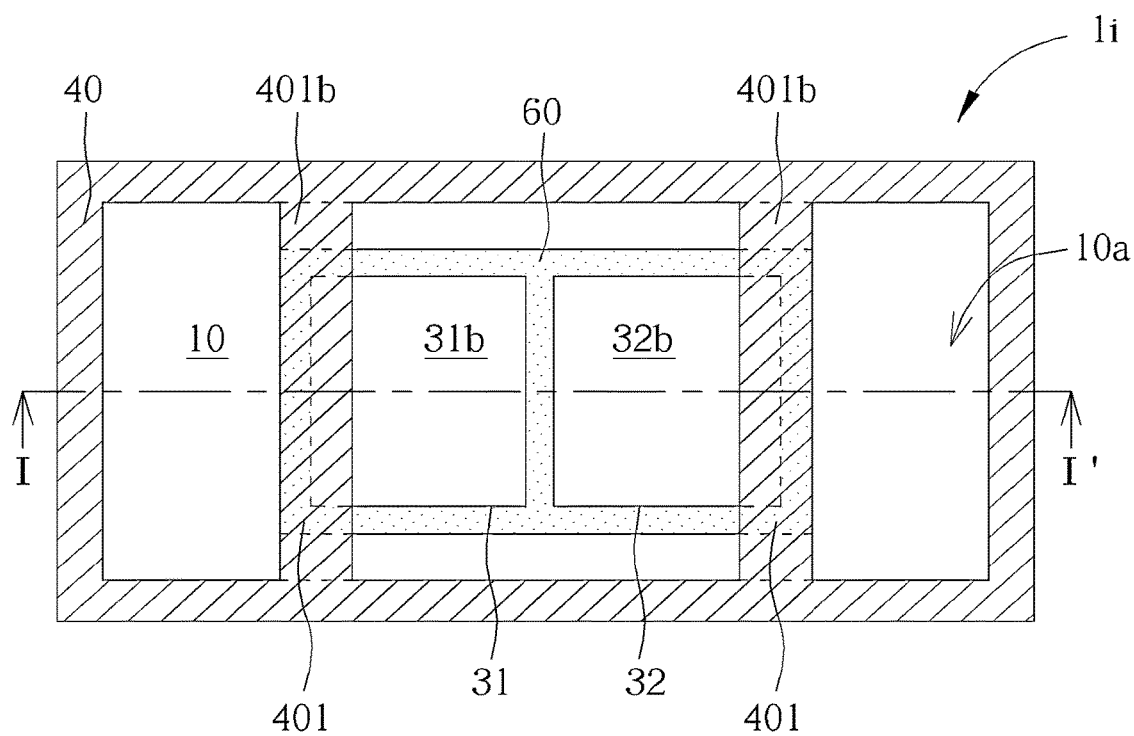
FIG. 21 is a schematic, top view of a semiconductor package according to yet another embodiment of the invention.
Figure 22:
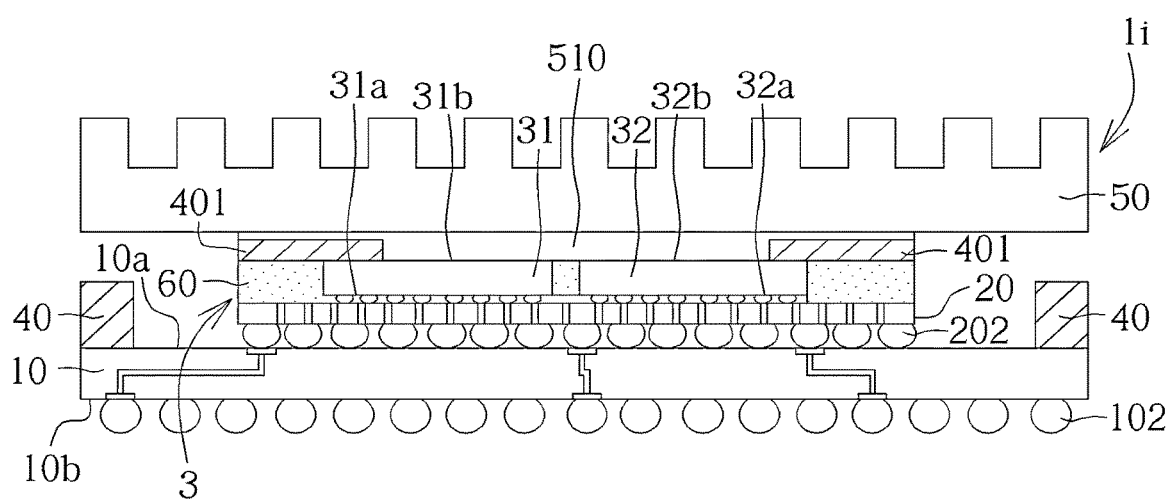
FIG. 22 is a schematic, cross-sectional diagram taken alone line I-I' in FIG. 21.

FIG. 21 and FIG. 22 show another embodiment of the invention, wherein like numeral numbers designate like regions, layers, or elements. FIG. 21 is a schematic, top view of a semiconductor package according to yet another embodiment of the invention. FIG. 22 is a schematic, cross-sectional diagram taken alone line I-I' in FIG. 21.

As shown in FIG. 21 and FIG. 22, a semiconductor package 1i is provided. The semiconductor package 1i may comprise a 2.5D fan-out semiconductor package 3. The semiconductor package 1i comprises a package substrate 10 having a top surface 10a and a bottom surface 10b. The 2.5D fan-out semiconductor package 3 is mounted on the top surface 10a. The first semiconductor die 31 and the second semiconductor die 32 are interconnected through a redistribution layer (RDL) structure 21. The RDL structure 21 is formed on the molding compound 60 and the active surfaces 31a and 32a of the first semiconductor die 31 and the second semiconductor die 32 to directly connect to the bond pads of the first semiconductor die 31 and the second semiconductor die 32.

According to one embodiment, the first semiconductor die 31 may comprise a SOC die, an application-specific integrated chip (ASIC) or a micro-processor, but is not limited thereto. The second semiconductor die 32 may comprise a high bandwidth memory (HBM) chip in which a plurality of memory chips having through silicon vias (TSVs) are stacked, or a DRAM die.

On the bottom surface 20b of the RDL structure 21, a plurality of connecting elements 202 are provided. Through the connecting elements 202, the RDL structure 21 is electrically connected to the package substrate 10. The molding compound 60 is provided to encapsulate the first semiconductor die 31 and the second semiconductor die 32. The rear surface 31b of the first semiconductor die 31 and the rear surface 32b of the second semiconductor die 32 are not covered by the molding compound 60.

According to the embodiment, a stiffener ring 40 is secured to the top surface 10a of the package substrate 10. The stiffener ring 40 may be disposed along the perimeter of the package substrate 10 so as to form a rectangular shape, for example. The stiffener ring 40 encircles the first semiconductor die 31 and the second semiconductor die 32. According to the embodiment, the stiffener ring 40 may be secured to the top surface 10a of the package substrate 10 by using an adhesive layer, but is not limited thereto. The stiffener ring 40 may be composed of copper, but is not limited thereto.

The stiffener ring 40 may comprise two reinforcement ribs 401 striding across the molding compound 60. As can be seen in FIG. 21, the reinforcement ribs 401 are integrally connected to the stiffener ring 40 through downset portions 401b. The reinforcement ribs 401 extend along the two opposite side edges of the 2.5D fan-out semiconductor package 3. The reinforcement ribs 401 are in direct contact with the top surface 20a of the molding compound 60.

The heat sink 50 may be directly bonded to a rear surface 31b of the first semiconductor die 31, a rear surface 32b of the second semiconductor die 32, and a top surface 401a of the reinforcement rib 401 through the thermal interface material layer 510. As can be seen in FIG. 21, the reinforcement ribs 401 may partially overlap with the rear surface of the first semiconductor die 31 or the second semiconductor die 32. For the sake of clarity, the heat sink 50 is not shown in FIG. 21. The reinforcement ribs 401 may be in direct contact with the rear surface of the first semiconductor die 31 or the second semiconductor die 32. The reinforcement ribs 401 may be a straight-line shaped rib across the molding compound 60 when viewed from the above. However, it is understood that the reinforcement ribs 401 may have other shapes.

Figure 23:
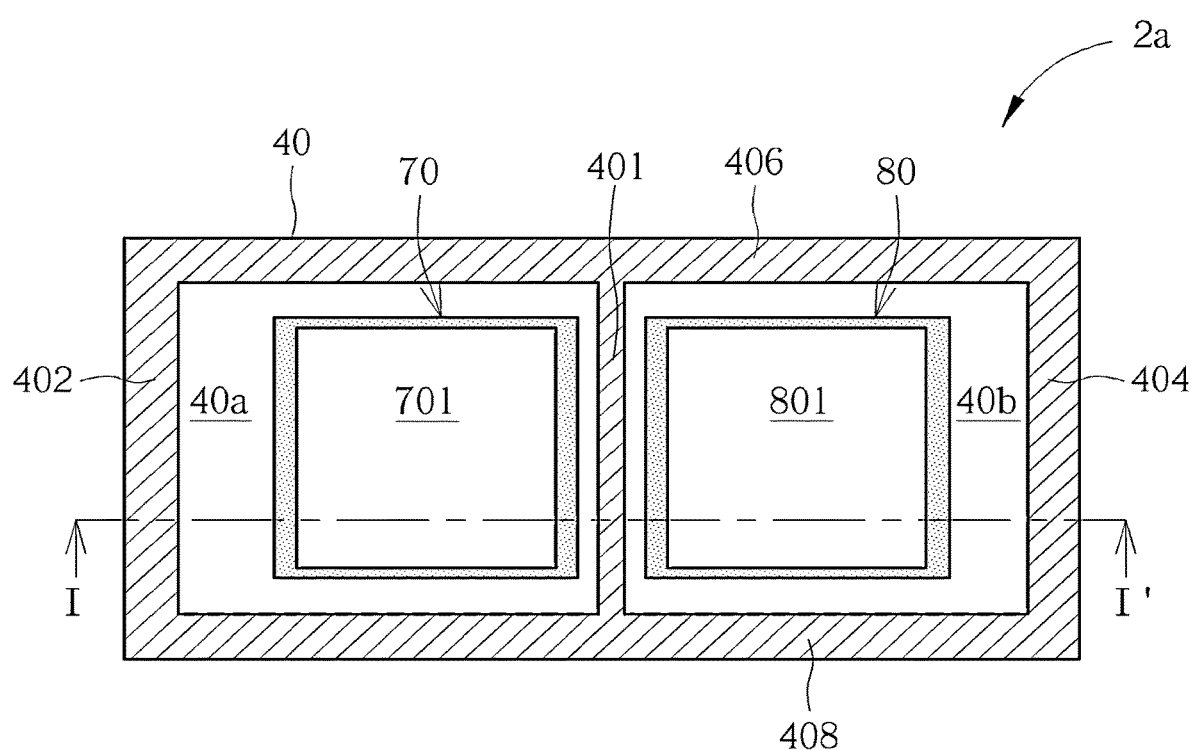
FIG. 23 is a schematic, top view of a semiconductor package having a package array partitioned by a stiffener ring with a reinforcement rib according to yet another embodiment of the invention.
Figure 24:
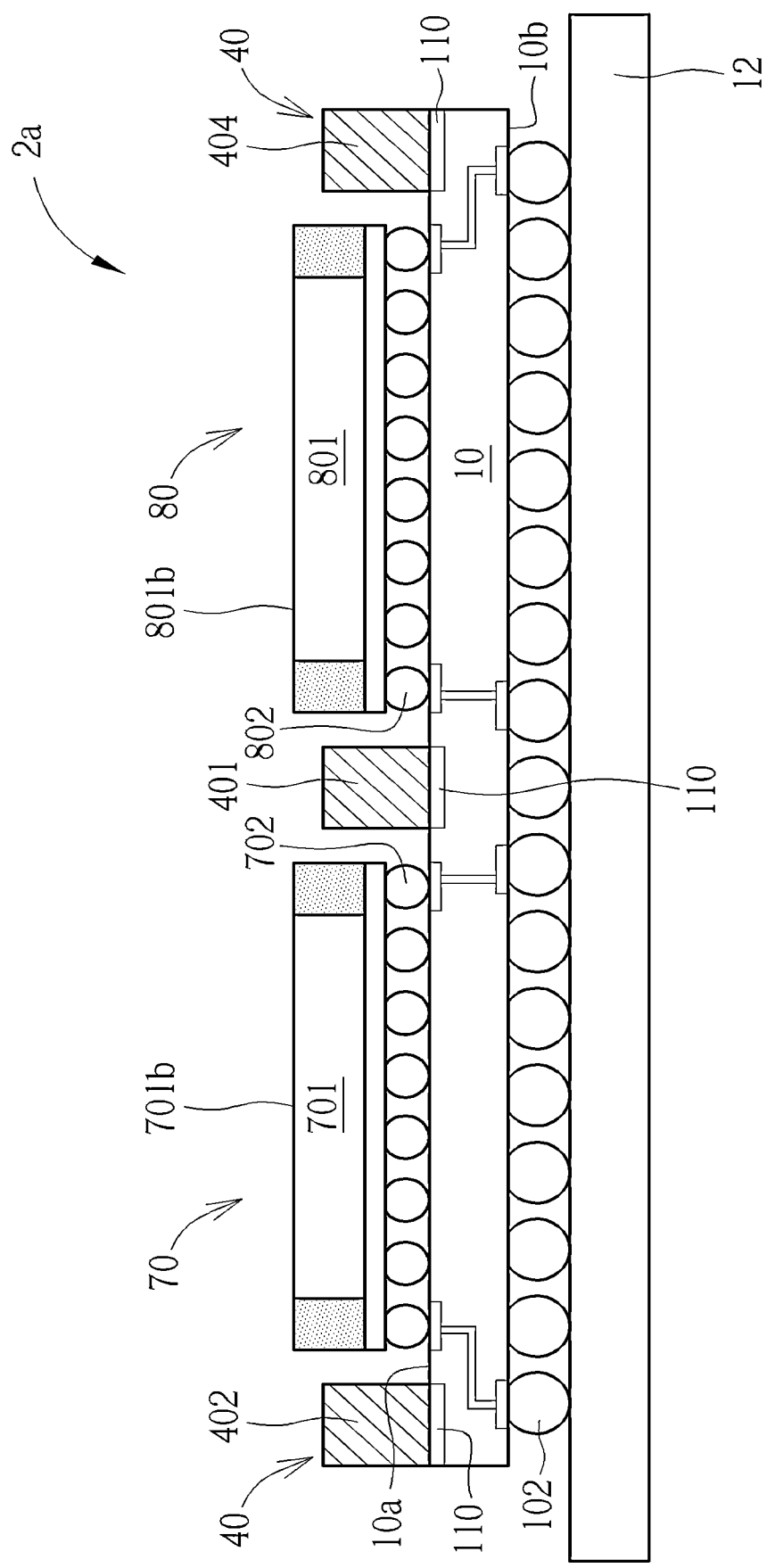
FIG. 24 is a schematic, cross-sectional diagram taken alone line I-I' in FIG. 23.

FIG. 23 and FIG. 24 show another embodiment of the invention, wherein like numeral numbers designate like regions, layers, or elements. FIG. 23 is a schematic, top view of a semiconductor package according to yet another embodiment of the invention. FIG. 24 is a schematic, cross-sectional diagram taken alone line I-I' in FIG. 23.

As shown in FIG. 23 and FIG. 24, a semiconductor package 2a is provided. The semiconductor package 2a comprises a stiffener ring 40 mounted on the top surface 10a of the package substrate 10. According to the embodiment, the stiffener ring 40 may have a grid frame of substantially rectangular outline, but is not limited thereto. The stiffener ring 40 comprises a strip-shaped reinforcement rib 401 that is coplanar with the grid frame of the stiffener ring 40 on the top surface 10a of the package substrate 10. According to the embodiment, the reinforcement rib 401 crosses the center of the semiconductor package 2a. According to one embodiment of the invention, the reinforcement rib 401 is formed integrally with the stiffener ring 40. For example, the reinforcement rib 401 and the stiffener ring 40 are formed of a monolithic metal piece such as copper or copper alloys, but is not limited thereto. According to one embodiment of the invention, the stiffener ring 40 may have a width that is different from that of the reinforcement rib 401. For example, the width of the stiffener ring 40 may be greater than the width of the reinforcement rib 401.

The reinforcement rib 401 is in parallel with the two side bars 402 and 404 of the stiffener ring 40. The reinforcement rib 401 is disposed between the two side bars 402 and 404 and is integrally connected to the two side bars 406 and 408 of the stiffener ring 40. Two compartments 40a and 40b are defined by the stiffener ring 40 and the reinforcement rib 401. Two individual chip packages 70 and 80 are mounted on the chip mounting regions within the two compartments 40a and 40b, respectively. According to one embodiment of the invention, the two chip packages 70 and 80 are electrically connected to each other only through the package substrate 10. The two chip packages 70 and 80 are spaced apart from each other with the reinforcement rib 401 interposed therebetween. The two chip packages 70 and 80 are separated by the reinforcement rib 401 on the top surface 10a of the package substrate 10. The two chip packages 70 and 80 form a package array partitioned by the stiffener ring 40 on the top surface 10a of the package substrate 10.

According to the embodiment, optionally, the stiffener ring 40 and/or the reinforcement rib 401 may be disposed on a ground ring 110 on the top surface 10a of the package substrate 10. The stiffener ring 40 and/or the reinforcement rib 401 may be soldered onto the ground ring 110. Alternatively, the stiffener ring 40 and/or the reinforcement rib 401 may be adhered onto the ground ring 110. In operation, the stiffener ring 40 and the reinforcement rib 401 may be provided with a ground voltage through the ground ring 110. The package substrate 10 may comprise a plurality of solder pads, interconnect elements, and layers of circuit lines or traces on a dielectric core. The signals from or to the chip packages 70 and 80 may be transmitted through the solder pads, interconnect elements, and the traces.

According to one embodiment of the invention, the chip package 70 may comprise a semiconductor die 701 such as a SOC die, an application-specific integrated chip (ASIC) or a micro-processor, but is not limited thereto. The chip package 80 may comprise a semiconductor die 801 such as a high bandwidth memory (HBM) chip in which a plurality of memory chips having through silicon vias (TSVs) are stacked, or a DRAM die. According to one embodiment of the invention, the chip packages 70 and 80 may be flip-chip chip-scale packages (FCCSPs) or wafer-level packages (WLPs), but is not limited thereto. According to one embodiment of the invention, the chip packages 70 and 80 may be ball-grid array (BGA) packages and may be mounted on the top surface 10a of the package substrate 10 through the connecting elements 702 and 802, respectively. For example, the connecting elements 702 and 802 may comprise solder balls or bumps, but is not limited thereto. Although not shown in the figures, it is to be understood that an underfill may be applied to encapsulate the connecting elements 702 and 802 between the package substrate 10 and the chip packages 70 and 80.

The semiconductor package 2a may be mounted on a printed circuit board (PCB) 12. The semiconductor package 2a may be electrically coupled to the PCB 12 through the connecting elements 102. For example, the connecting elements 102 may comprise ball-grid array (BGA) solder balls or bumps, but is not limited thereto.

According to one embodiment of the invention, a rear surface 701b of the chip package 70 and a rear surface 801b of the chip package 80 may be exposed. According to one embodiment of the invention, the rear surface 701b of the chip package 70 and the rear surface 801b of the chip package 80 may be flush with a top surface of the stiffener ring 40 and/or the reinforcement rib 401 such that when mounting a heat sink (as the heat sink 50 depicted in FIG. 22) on the semiconductor package 2a, the heat sink may be in direct contact with the rear surface 701b of the chip package 70, the rear surface 801b of the chip package 80, and the top surface of the stiffener ring 40 and/or the reinforcement rib 401. However, it is to be understood that in some embodiments the top surface of the stiffener ring 40 and/or the reinforcement rib 401 may be lower than the rear surface 701b of the chip package 70 and the rear surface 801b of the chip package 80.

Figure 25:
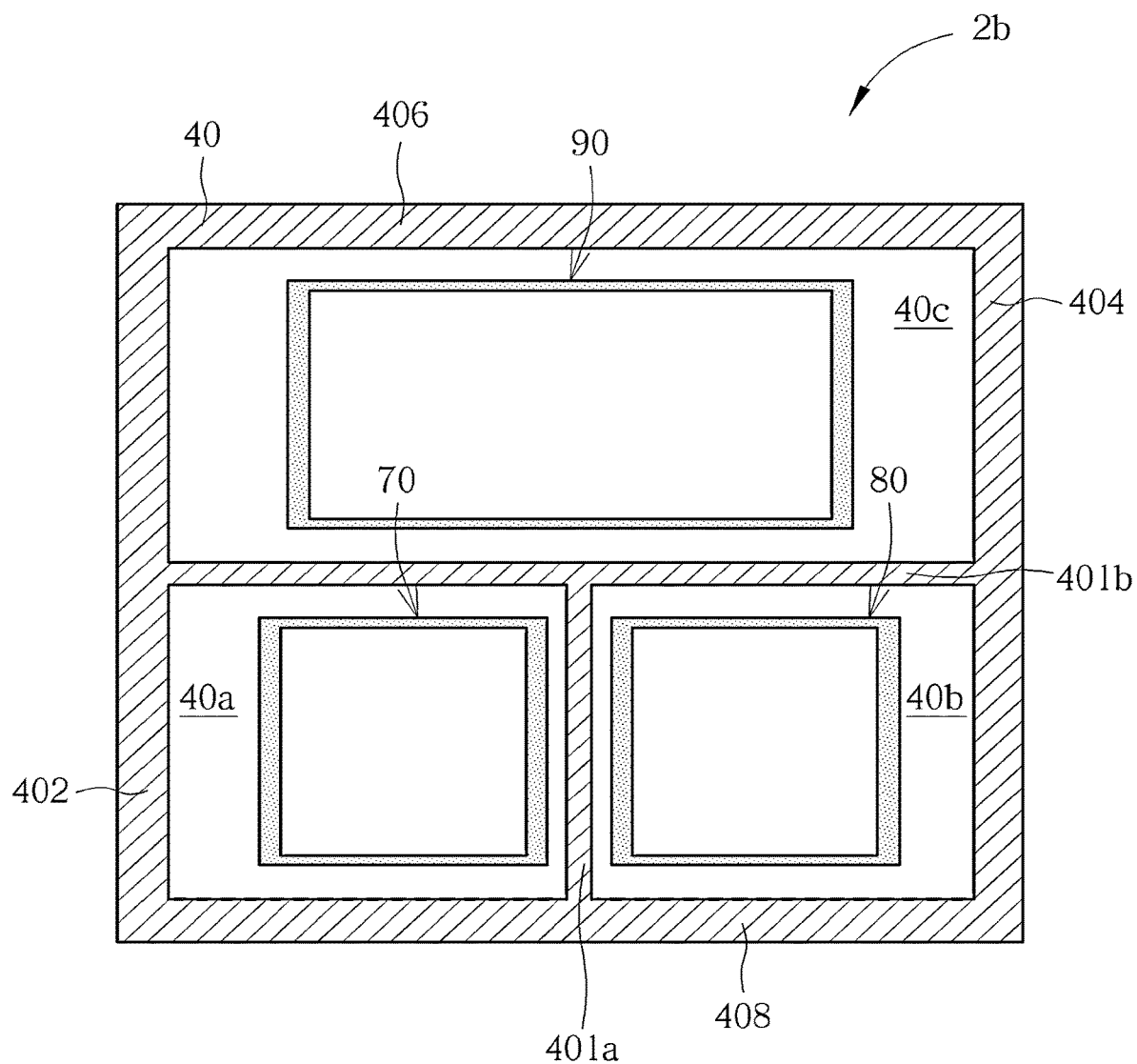
FIG. 25 is a schematic, top view of a semiconductor package having a package array partitioned by a stiffener ring with reinforcement ribs according to yet another embodiment of the invention, wherein like numeral numbers designate like regions, layers, or elements.
Figure 26:
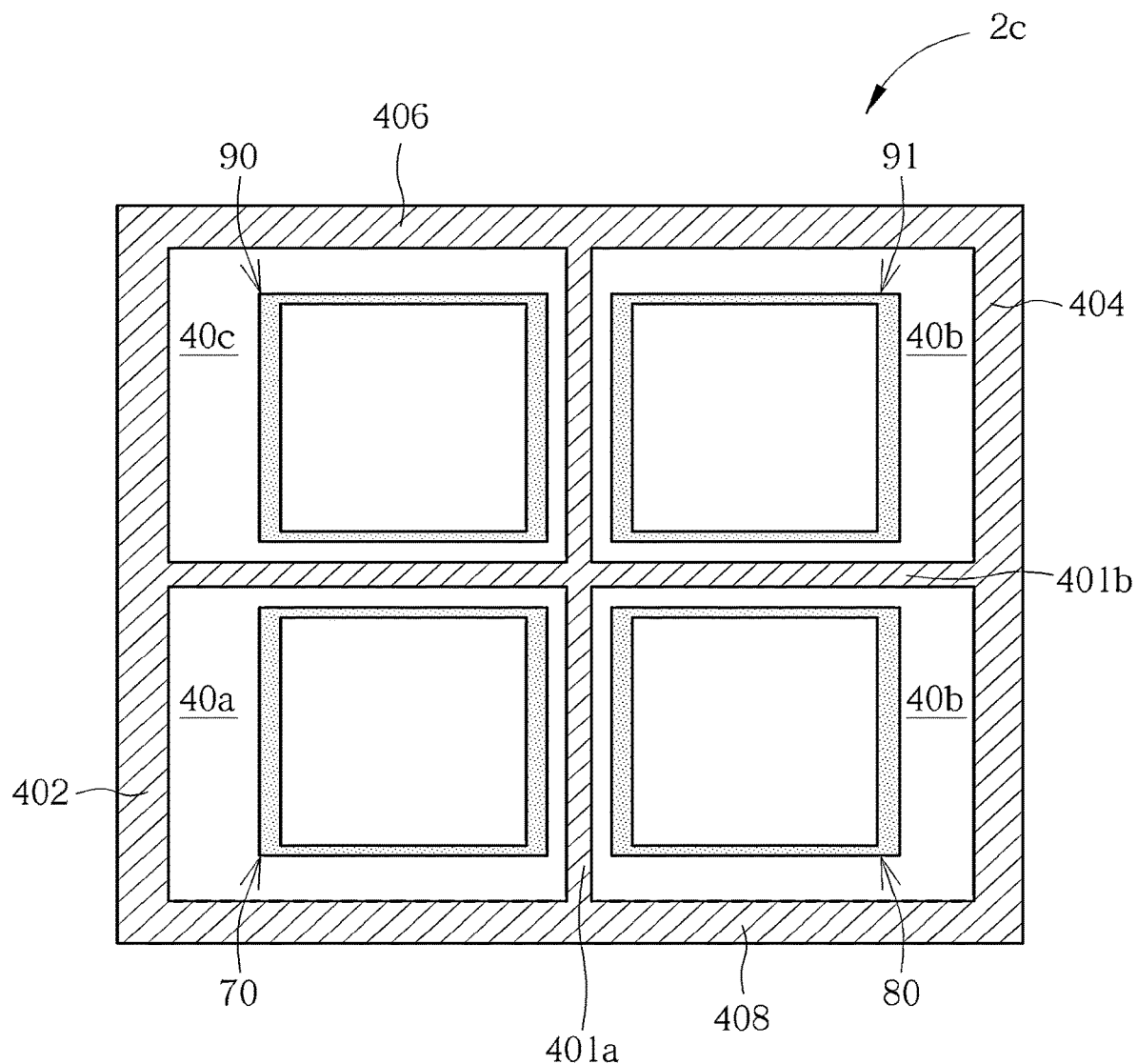
FIG. 26 is a schematic, top view of a semiconductor package having a package array partitioned by a stiffener ring with reinforcement ribs according to yet another embodiment of the invention, wherein like numeral numbers designate like regions, layers, or elements.

It is to be understood that the aforesaid package array may comprise more semiconductor packages, for example, three or more than three semiconductor packages, as shown in FIG. 25 and FIG. 26. In FIG. 25, likewise, the semiconductor package 2b comprises a stiffener ring 40 mounted on the top surface of the package substrate (as the package substrate 10 depicted in FIG. 24). According to the embodiment, the stiffener ring 40 may have a grid frame of substantially rectangular outline, but is not limited thereto. The stiffener ring 40 comprises a first reinforcement rib 401a and a second reinforcement rib 401b that are coplanar with the grid frame of the stiffener ring 40 on the top surface of the package substrate. According to the embodiment, the first reinforcement rib 401a and the second reinforcement rib 401b cross the center of the semiconductor package 2b. The second reinforcement rib 401b extends between the side bar 402 and the side bar 404. The first reinforcement rib 401a extends between the second reinforcement rib 401b and the side bar 408.

According to one embodiment of the invention, the first and second reinforcement ribs 401a and 401b are formed integrally with the stiffener ring 40. For example, the first and second reinforcement ribs 401a and 401b and the stiffener ring 40 are formed of a monolithic metal piece such as copper or copper alloys, but is not limited thereto. According to one embodiment of the invention, the grid frame of the stiffener ring 40 may have a width that is different from that of the first and second reinforcement ribs 401a and 401b. For example, the width of the grid frame of the stiffener ring 40 may be greater than the widths of the first and second reinforcement ribs 401a and 401b.

Three compartments 40a, 40b and 40c are defined by the grid frame of the stiffener ring 40 and the first and second reinforcement ribs 401a and 401b. Three individual chip packages 70, 80 and 90 are mounted on the chip mounting regions within the three compartments 40a, 40b and 40c, respectively. According to one embodiment of the invention, the three chip packages 70, 80 and 90 are electrically connected to one another only through the package substrate.

In FIG. 26, likewise, the semiconductor package 2c comprises a stiffener ring 40 mounted on the top surface of the package substrate (as the package substrate 10 depicted in FIG. 24). According to the embodiment, the stiffener ring 40 may have a grid frame of substantially rectangular outline, but is not limited thereto. The stiffener ring 40 comprises a first reinforcement rib 401a and a second reinforcement rib 401b that are coplanar with the grid frame of the stiffener ring 40 on the top surface of the package substrate. According to the embodiment, the first reinforcement rib 401a and the second reinforcement rib 401b cross the center of the semiconductor package 2c. The second reinforcement rib 401b extends between the side bar 402 and the side bar 404. The first reinforcement rib 401a extends between the side bar 406 and the side bar 408. The first reinforcement rib 401a intersects the second reinforcement rib 401b approximately at the center of the semiconductor package 2c.

According to one embodiment of the invention, the first and second reinforcement ribs 401a and 401b are formed integrally with the stiffener ring 40. For example, the first and second reinforcement ribs 401a and 401b and the stiffener ring 40 are formed of a monolithic metal piece such as copper or copper alloys, but is not limited thereto. According to one embodiment of the invention, the stiffener ring 40 may have a width that is different from that of the first and second reinforcement ribs 401a and 401b. For example, the width of the stiffener ring 40 may be greater than the widths of the first and second reinforcement ribs 401a and 401b.

Four compartments 40a, 40b, 40c, and 40d are defined by the stiffener ring 40 and the first and second reinforcement ribs 401a and 401b. Four individual chip packages 70, 80, 90, and 91 are mounted on the chip mounting regions within the four compartments 40a, 40b and 40c, respectively. According to one embodiment of the invention, the four chip packages 70, 80, 90, and 91 are electrically connected to one another only through the package substrate.

Figure 27:
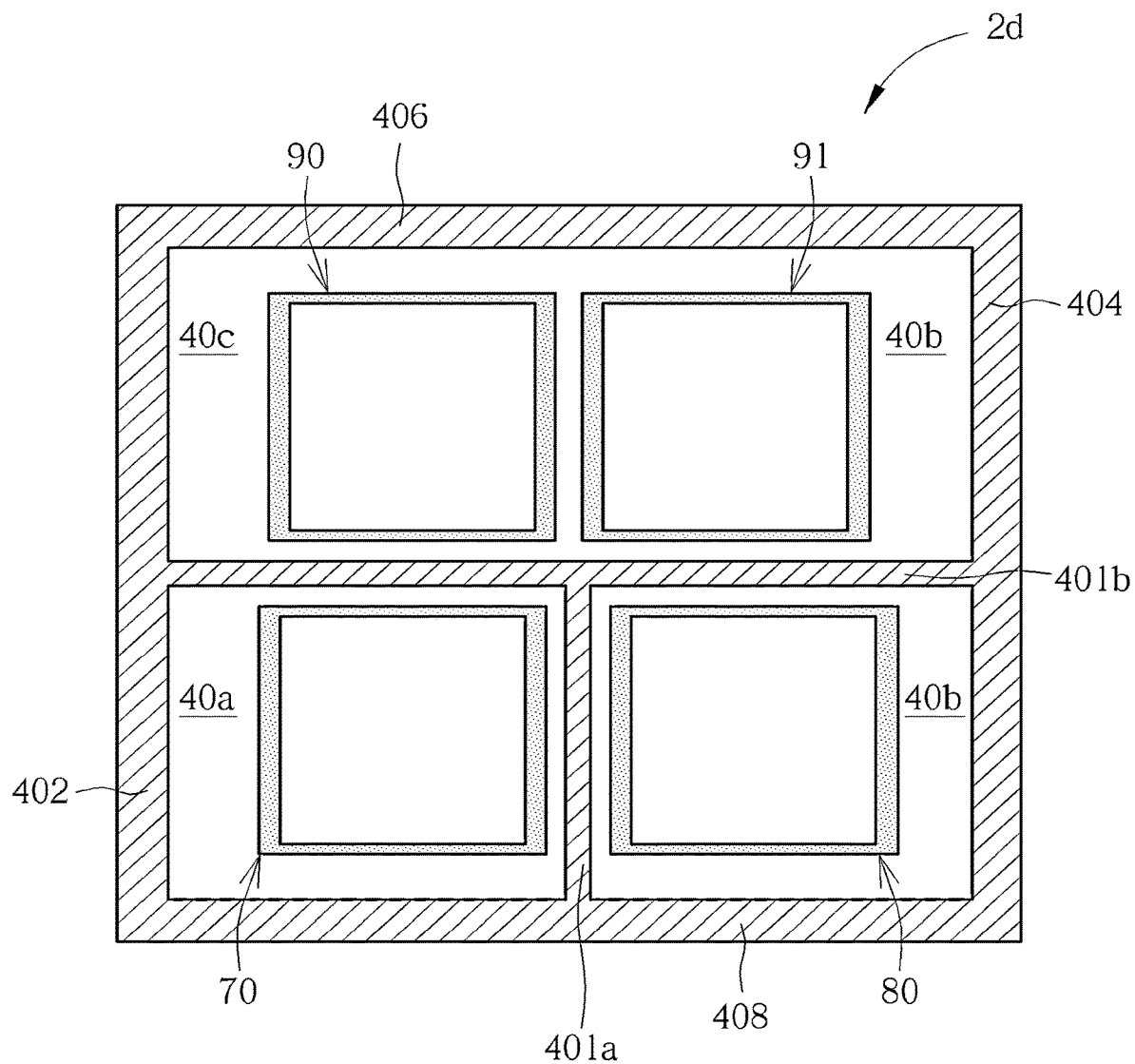
FIG. 27 is a schematic, top view of a semiconductor package having a package array partitioned by a stiffener ring with reinforcement ribs according to yet another embodiment of the invention, wherein like numeral numbers designate like regions, layers, or elements.

It is to be understood that the present disclosure is not limited to a one-compartment-one-chip package arrangement. For example, in some embodiments, two or more chip packages may be mounted on a chip mounting region within one compartment. As shown in FIG. 27, the semiconductor package 2d comprises only three compartments 40a, 40b and 40c defined by the stiffener ring 40 and the first and second reinforcement ribs 401a and 401b. The chip packages 90 and 91 together are mounted within the compartment 40c.

Figure 28:
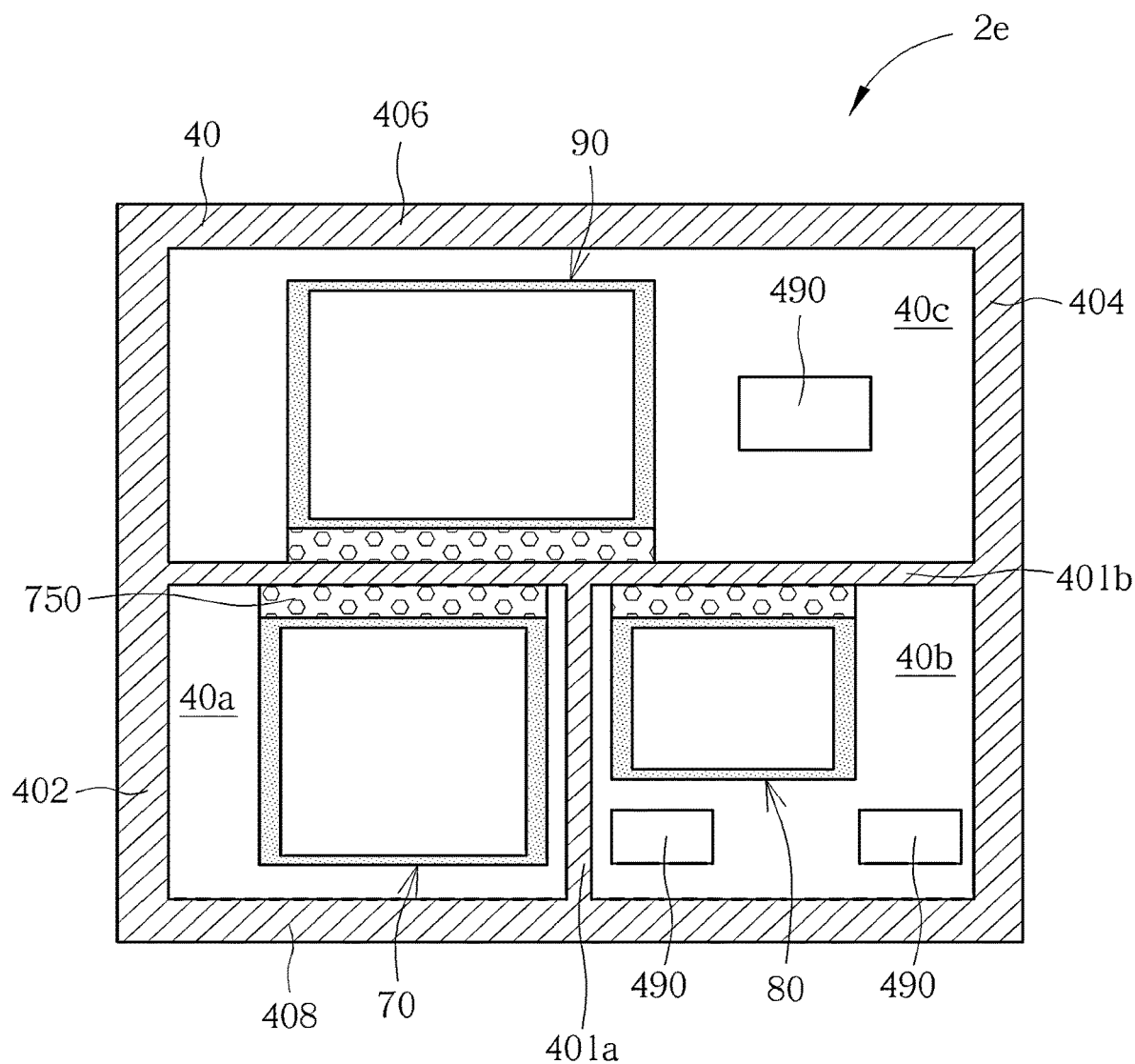
FIG. 28 is a schematic, top view of a semiconductor package having a package array partitioned by a stiffener ring with reinforcement ribs according to yet another embodiment of the invention, wherein like numeral numbers designate like regions, layers, or elements.

It is to be understood that other circuit elements may be mounted on the top surface of the substrate along with the chip packages. These circuit elements may comprise surface mount technique (SMT) elements. As shown in FIG. 28, for example, the semiconductor package 2e comprises circuit elements 490 such as passive elements mounted on the top surface of the package substrate along with the chip packages 80 and 90.

In some embodiments, as shown in FIG. 28, the chip packages 70, 80 and 90 may be in thermally contact with the stiffener ring 40 and/or the first and second reinforcement ribs 401a and 401b. For example, a thermally conductive glue or paste 750 may be applied to the gap between the chip packages 70, 80 and 90 and the second reinforcement ribs 401a and 401b, as shown in FIG. 28. By providing such configuration, the heat generated by the chip packages 70, 80 and 90 may be dissipated in a more efficient way.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
   a package substrate having a top surface and a bottom surface;
   a stiffener ring mounted on the top surface of the package substrate, wherein the stiffener ring comprises a reinforcement rib, and wherein the stiffener ring and the reinforcement rib are adhered onto a ground ring of the package substrate, the ground ring being configured to provide a ground voltage to the stiffener ring;
   at least two compartments defined by the stiffener ring and the reinforcement rib; and
   at least two individual chip packages mounted on chip mounting regions within the at least two compartments, respectively, in a side-by-side manner on the top surface of the package substrate, thereby constituting a package array on the package substrate.

2. The semiconductor package according to claim 1 wherein the reinforcement rib is a strip-shaped reinforcement rib.

3. The semiconductor package according to claim 1, wherein the reinforcement rib crosses a center of the semiconductor package.

4. The semiconductor package according to claim 1, wherein the reinforcement rib is interposed between the at least two individual chip packages.

5. The semiconductor package according to claim 1, wherein the stiffener ring comprises a grid frame of substantially rectangular outline, and the reinforcement rib is coplanar with the grid frame on the top surface of the package substrate.

6. The semiconductor package according to claim 5, wherein the grid frame of the stiffener ring has a width that is different from that of the reinforcement rib.

7. The semiconductor package according to claim 1, wherein the at least two individual chip packages are electrically connected to each other through the package substrate.

8. The semiconductor package according to claim 1, wherein the at least two individual chip packages are electrically connected to each other only through the package substrate.

9. The semiconductor package according to claim 1, wherein the at least two individual chip packages are separated by the reinforcement rib on the top surface of the package substrate.

10. The semiconductor package according to claim 1, wherein the at least two individual chip packages are flip-chip chip-scale packages or wafer-level packages.

11. The semiconductor package according to claim 1, wherein a plurality of connecting elements are provided on the bottom surface of the package substrate and wherein the package substrate is mounted onto a printed circuit board through the plurality of connecting elements.

12. The semiconductor package according to claim 1, wherein a rear surface of one of the at least two individual chip packages is exposed.

13. The semiconductor package according to claim 1, wherein the reinforcement rib and the stiffener ring are formed of a monolithic metal piece.

14. The semiconductor package according to claim 13 further comprising:
   a thermally conductive glue or paste disposed in a gap between the at least two individual chip packages and the reinforcement rib.

15. The semiconductor package according to claim 1 further comprising:
   surface mount technique (SMT) elements mounted on the top surface of the package substrate along with the at least two individual chip packages.

16. The semiconductor package according to claim 1, wherein the at least two individual chip packages are in thermal contact with the stiffener ring and/or the reinforcement rib.

17. The semiconductor package according to claim 1, wherein a rear surface of one of the at least two individual chip packages is flush with a top surface of the stiffener ring.

18. The semiconductor package according to claim 1, wherein a top surface of the stiffener ring is lower than a rear surface of one or more of the at least two individual chip packages.

19. The semiconductor package according to claim 1, wherein the reinforcement rib is connected to the stiffener ring at a first end and a second end of the reinforcement rib.

20. A semiconductor package, comprising:
   a package substrate having a top surface and a bottom surface;
   a stiffener ring mounted on the top surface of the package substrate, wherein the stiffener ring comprises a reinforcement rib, and wherein the stiffener ring and the reinforcement rib are adhered onto a ground ring of the package substrate, the ground ring being configured to provide a ground voltage to the stiffener ring;
   at least two compartments defined by the stiffener ring and the reinforcement rib; and
   at least two individual chip packages mounted on chip mounting regions within the at least two compartments, respectively, thereby constituting a package array.

* * * * *